United States Patent
Kobayashi et al.

(10) Patent No.: US 9,589,907 B2
(45) Date of Patent: Mar. 7, 2017

(54) APPARATUS AND METHOD FOR ELECTROSTATIC SPRAYING OR ELECTROSTATIC COATING OF A THIN FILM

(71) Applicant: Apic Yamada Corporation, Chikuma-shi, Nagano (JP)

(72) Inventors: Kazuhiko Kobayashi, Chikuma (JP); Keisuke Suda, Chikuma (JP)

(73) Assignee: Apic Yamada Corporation, Nagano (JP)

( * ) Notice: Subject to any disclaimer, the term of this patent is extended or adjusted under 35 U.S.C. 154(b) by 0 days.

(21) Appl. No.: 14/648,587

(22) PCT Filed: Nov. 11, 2013

(86) PCT No.: PCT/JP2013/006611
§ 371 (c)(1),
(2) Date: May 29, 2015

(87) PCT Pub. No.: WO2014/083782
PCT Pub. Date: Jun. 5, 2014

(65) Prior Publication Data
US 2015/0303151 A1 Oct. 22, 2015

(30) Foreign Application Priority Data

Nov. 30, 2012 (JP) .................................. 2012-262944
Dec. 10, 2012 (JP) .................................. 2012-269360
(Continued)

(51) Int. Cl.
*H01L 23/552* (2006.01)
*B05B 5/025* (2006.01)
(Continued)

(52) U.S. Cl.
CPC ............ *H01L 23/552* (2013.01); *B05B 5/025* (2013.01); *B05B 5/14* (2013.01); *B29C 33/58* (2013.01);
(Continued)

(58) Field of Classification Search
CPC ...................................................... B29C 41/006
(Continued)

(56) References Cited

U.S. PATENT DOCUMENTS 6,410,883 B1    6/2002  Furuta
6,756,084 B2 *  6/2004  Fulton ................... B05D 1/025
                                                                427/458
(Continued)

FOREIGN PATENT DOCUMENTS

JP     61-42462 A     2/1986
JP     1-146946 A    6/1989
(Continued)

OTHER PUBLICATIONS

Search Report dated Feb. 18, 2014 issued by the International Searching Authority in counterpart International Patent Application No. PCT/JP2013/006611 (PCT/ISA/210).
(Continued)

*Primary Examiner* — Timothy Kennedy
(74) *Attorney, Agent, or Firm* — Sughrue Mion, PLLC

(57) ABSTRACT

Provided is a resist film forming device which uses an electrostatic spray device which is capable of forming a thin film with a uniform thickness on a workpiece. A resist film forming device (100), which forms a resist film (108) on a substrate by electrostatic spraying, comprises: a nozzle (102) which, upon application of a prescribed voltage, sprays liquid particles which form the raw material for a resist film (108) toward a substrate (105) having stepped portions (105*a*); a driving means (111) for causing relative
(Continued)

movement of the substrate (105) or the nozzle (102); and a control means (110) for controlling such that the resist film (108) is formed on the substrate (105) having the stepped portions (105*a*) by the liquid particles.

8 Claims, 21 Drawing Sheets

(30) Foreign Application Priority Data

Dec. 13, 2012 (JP) .................. 2012-271920
Feb. 15, 2013 (JP) .................. 2013-027357

(51) Int. Cl.
| | |
|---|---|
| *B29C 33/58* | (2006.01) |
| *B29C 33/72* | (2006.01) |
| *H01L 21/67* | (2006.01) |
| *H01L 23/00* | (2006.01) |
| *B05B 5/14* | (2006.01) |
| *H01L 21/3205* | (2006.01) |
| *H01L 21/321* | (2006.01) |
| *H05K 1/11* | (2006.01) |

(52) U.S. Cl.
CPC ............ *B29C 33/72* (2013.01); *H01L 21/321* (2013.01); *H01L 21/3205* (2013.01); *H01L 21/6715* (2013.01); *H01L 24/24* (2013.01); *H01L 24/76* (2013.01); *H01L 24/82* (2013.01); *H01L 24/85* (2013.01); *H05K 1/11* (2013.01); *H01L 2224/32145* (2013.01); *H01L 2224/451* (2013.01); *H01L 2224/45147* (2013.01); *H01L 2224/48091* (2013.01); *H01L 2224/73265* (2013.01); *H01L 2224/73267* (2013.01); *H01L 2224/8592* (2013.01); *H01L 2924/12041* (2013.01); *H01L 2924/1461* (2013.01); *H01L 2924/181* (2013.01); *H01L 2924/3025* (2013.01)

(58) Field of Classification Search
USPC .................. 264/446; 427/458, 483
See application file for complete search history.

(56) References Cited

U.S. PATENT DOCUMENTS

| | | | |
|---|---|---|---|
| 7,334,881 | B2 | 2/2008 | Punsalan et al. |
| 2002/0070446 | A1 | 6/2002 | Horiuchi et al. |
| 2003/0029379 | A1 | 2/2003 | Onogawa et al. |
| 2007/0087564 | A1* | 4/2007 | Speakman ............ H01G 9/2031 438/674 |
| 2007/0116881 | A1 | 5/2007 | Terada et al. |
| 2008/0116598 | A1 | 5/2008 | Miyajima et al. |
| 2009/0224437 | A1 | 9/2009 | Fukuoka et al. |
| 2011/0042808 | A1 | 2/2011 | Kumazawa et al. |
| 2011/0163035 | A1 | 7/2011 | Cheng et al. |
| 2011/0187798 | A1* | 8/2011 | Rogers ...................... B41J 2/06 347/55 |

FOREIGN PATENT DOCUMENTS

| | | |
|---|---|---|
| JP | 1-207473 A | 8/1989 |
| JP | 2-86016 A | 3/1990 |
| JP | 5-5271 A | 1/1993 |
| JP | 6-182519 A | 7/1994 |
| JP | 9-155283 A | 6/1997 |
| JP | 10-249248 A | 9/1998 |
| JP | 11-54656 A | 2/1999 |
| JP | 11-213760 A | 8/1999 |
| JP | 2000-188416 A | 7/2000 |
| JP | 2000-334746 A | 12/2000 |
| JP | 2002-184934 A | 6/2002 |
| JP | 2002-290199 A | 10/2002 |
| JP | 2003-135997 A | 5/2003 |
| JP | 2003-225591 A | 8/2003 |
| JP | 2004-160287 A | 6/2004 |
| JP | 2004-181665 A | 7/2004 |
| JP | 2005-40665 A | 2/2005 |
| JP | 2005-252335 A | 9/2005 |
| JP | 2006-150693 A | 6/2006 |
| JP | 2007-105739 A | 4/2007 |
| JP | 2007-142234 A | 6/2007 |
| JP | 2007-175576 A | 7/2007 |
| JP | 2008-149705 A | 7/2008 |
| JP | 2009-16490 A | 1/2009 |
| JP | 2009-183874 A | 8/2009 |
| JP | 2011-9725 A | 1/2011 |
| JP | 2011-23387 A | 2/2011 |
| JP | 2012-99315 A | 5/2012 |
| JP | 2012-187531 A | 10/2012 |
| TW | 200531842 A | 10/2005 |
| TW | 200904640 A | 2/2009 |
| TW | I330593 A | 9/2010 |
| TW | 201124197 A1 | 7/2011 |
| WO | 2005/122646 A1 | 12/2005 |
| WO | 2007/069381 A1 | 6/2007 |
| WO | 2009/136468 A1 | 11/2009 |

OTHER PUBLICATIONS

Office Action dated Apr. 29, 2015 issued by the Taiwanese Patent Office in counterpart Taiwanese Patent Application No. 102142089.
Communication issued Jun. 7, 2016, issued by the Japanese Patent Office in counterpart Japanese Patent Application No. 2012-269360.
Communication issued Jun. 7, 2016, issued by the Japanese Patent Office in counterpart Japanese Patent Application No. 2012-262944.
Li et al., "Electrospray Deposition of Silver Nanowire Films for Transparent Electrodes", Journal of Nanoscience and Nanotechnology, Jul. 2012, vol. 12, No. 7, pp. 5981-5985, American Scientific Publishers, USA (6 pages total).
Communication dated Aug. 23, 2016 issued by the Japanese Patent Office in counterpart Japanese Patent Application No. 2012-269360.
Communication dated Aug. 23, 2016 issued by the Japanese Patent Office in counterpart Japanese Patent Application No. 2012-271920.

* cited by examiner

| | PTFE FILM FORMED BY ELECTROSTATIC SPRAYING | | | PTFE FILM FORMED BY DROPPING | | |
|---|---|---|---|---|---|---|
| PARTICLE DIAMETER | 300nm | 300nm (WITH PROTECTION) | 3μm | 300nm | 300nm (WITH PROTECTION) | 3μm |
| TRANSMITTANCE (AT 250 nm) | 75% | 60% | 80% | 27% | 36% | 24% |
| FILM THICKNESS | 0.7μm | 2μm | 2μm | 4μm | 5μm | 6μm |

APPARATUS AND METHOD FOR ELECTROSTATIC SPRAYING OR ELECTROSTATIC COATING OF A THIN FILM

TECHNICAL FIELD

The present invention relates to a method for forming a film, interconnections, and a particles dispersion layer by electrostatic spraying or electrostatic coating.

The invention also relates to a resin molding apparatus and method and, in particular, to a resin molding apparatus and method in which a cleaning process is facilitated.

Furthermore, the invention relates to a thin-film forming apparatus for forming a thin film on a wire by electrostatic spraying and to an organic EL device formed by using a wire.

Still further, the invention relates to an apparatus and method for forming bumps or interconnections on a work by electrostatic spraying or electrostatic coating.

BACKGROUND ART

Resist film forming methods are known that employ a liquid immersion method in which a work (substrate) is immersed in resist liquid, a printing method which utilizes plate asperities, or a spin coating method in which resist liquid is supplied to a work and a thin film is formed utilizing centrifugal force produced by rotating the work at high speed. For example, Patent Document 1 discloses a resist film forming method which employs a spin coating method.

Patent Document 2 discloses a semiconductor device in which a phosphor is evaporated by electron beam evaporation. Also known is a method which forms a phosphor by potting or using a dispenser. Patent Document 3 discloses a film forming method which forms a thin film by coating the surface of a particular target object with a liquid material. In background-art film forming methods, a semiconductor chip is covered with an electromagnetic shield case or subjected to plating for electromagnetic shielding.

Patent Document 4 discloses a manufacturing method of a positive electrode of a lithium battery in which a composite material positive electrode is manufactured using PTFE (polytetrafluoroethylene). Patent Document 5 discloses a resin-coated metal plate that uses PTFE. Patent Document 6 discloses a molten metal discharging apparatus that is equipped with plural nozzle holes and a storage chamber in which molten metal is stored. Patent Document 7 discloses a method for forming electrodes of a BGA package.

In a back ground art, a cleaning process is executed with proper timing in performing work resin molding using a die. In an example cleaning process, first, molding is performed using a melamine-based cleaning agent (called a cleaning shot) to remove stain from a die. Since a release agent is removed from the die at this time, a die fittability enhancing material (resin) containing a release agent is molded, whereby a release film is formed on the die. Subsequently, to prevent reduction of the reliability of a resin mold due to contamination of a work molding resin with the release agent, dummy shots are made before work resin molding. Au excess die fittability enhancing material is removed by making a necessary number of dummy shots, whereby probability of occurrence of an event that a die fittability enhancing material is mixed into a work molding resin at the time of actual resin molding is made lower. Among other die cleaning methods are manual residue removal, plasma cleaning or ashing cleaning of a die surface, and cleaning using a liquid chemical.

Patent Document 8 discloses a resin molding apparatus that is equipped with a cleaning device for cleaning the die surface of a resin molding die. This cleaning device is equipped with an energy beam irradiation unit which irradiates the die surface of a resin molding die with an energy beam and thereby establishes a state that residual stain can easily be peeled off the die surface. With this configuration, stain is attached to a resulting resin mold when a molding material is subjected to resin molding and the resulting mold is thereby released from the die.

Patent Document 9 discloses a powder coating apparatus in which charged powder paint is attached electrostatically to the surface of a long object to be coated being conveyed continuously. The powder coating apparatus of Patent Document 9 has a doughnut-shaped main body. An electrostatic coating device having plural nozzles attached to the main body and corona discharge electrodes is configured in such a manner that a long object to be coated is conveyed so as to pass approximately the center of a cavity portion of the main body of the electrostatic coating device.

In a back ground art, bumps are formed on a board or a semiconductor chip. For example, Patent Document 6 discloses a molten metal discharging apparatus which is equipped with a pressurizing unit for pressurizing molten metal pulsatively and thereby discharging molten metal droplets from plural nozzle holes and in which the center axes of the plural nozzle holes are oriented so as to be converged on an extension line extending in the discharge direction. With this configuration, since discharged molten metal droplets collide with each other while they are flying, a desired amount of droplets that are in accordance with the number of nozzle holes can be discharged.

A method is known that a solvent containing a conductive substance such as metal fine particles is jetted from a nozzle in the form of a narrow beam and applied to a location to be repaired of a disconnected wiring pattern. For example, Patent Document 10 discloses an interconnection forming apparatus which can form or repair interconnections by focusing conductive particles so that they have a desired beam diameter.

PRIOR ART DOCUMENTS

Patent Documents

Patent Document 1: JP-2011-023387-A
Patent Document 2: JP-2000-188416-A
Patent Document 3: JP-2004-160287-A
Patent Document 4: JP-2012-099315-A
Patent Document 5: JP-H09-155283-A
Patent Document 6: JP-2007-105739-A
Patent Document 7: JP-H11-054656-A
Patent Document 8: JP-2008-149705-A
Patent Document 9: JP-2003-135997-A
Patent Document 10: JP-2009-016490-A

SUMMARY OF THE INVENTION

Problems to be Solved by the Invention

However, in liquid immersion methods and printing methods, a thick resist film is formed on a work with a considerable thickness variation, which results in rigidity reduction of the work itself. In spin coating methods as disclosed in Patent Document 1, 50%, for example, of resist liquid is scattered around, thereby causing a waste of resist liquid and results in cost increase. If a work is formed with steps, a resist does not stick uniformly to the side surfaces of the steps. If a work is formed with bumps, it is impossible to form a resist film on only around bumps excluding their top surfaces.

In background-art phosphor film forming methods like the method disclosed in Patent Document 2, it is difficult to form a uniform thin film stably. This may cause a problem that light emitted from an LED chip has color unevenness and thus high-quality light cannot be emitted stably.

In such background-art methods as disclosed in Patent Document 3 etc., a thin film cannot be formed so as to conform to a package shape or only at necessary locations. Furthermore, electromagnetic shielding cannot be given, after mounting on a board, to only components to be protected such as semiconductor chips that require electromagnetic shielding.

In such background-art methods as disclosed in Patent Documents 4 and 5 etc., a short-wavelength, high-transmittance insulative film such as a PTFE film is formed by evaporation or sputtering. Therefore, a vacuum environment needs to be prepared and local coating cannot be made.

In background-art molten metal discharging apparatuses as disclosed in Patent Document 6 etc., mixing of a trace amount of liquid is difficult and the reaction rate is low. Furthermore, it is impossible to mix a necessary amount of liquid, thereby causing a waste of a liquid agent.

In such background-art methods as disclosed in Patent Document 7 etc., insulating films around electrodes (bumps) are formed by exposure to light, which makes it necessary to use a mask. It is difficult to form such insulating films partially. Furthermore, it is difficult for such background-art methods to form a thin film on a bonding wire, in particular, after bonding.

Where dummy shots are made after a die cleaning process, the cleaning process becomes complex and takes long time. And a long, complicated cleaning process makes the production cost of resin molds high. On the other hand, such configurations as disclosed in Patent Document 8 are not preferable because stain is transferred to a mold product.

In the configuration of Patent Document 9, the plural nozzles discharge powder paint at a prescribed angle with respect to the radial direction of an object to be coated (wire). Therefore, with the configuration of Patent Document 9, it is difficult to form a uniform thin film though the efficiency of coating, with electrostatic powder, of the surface of a long object to be coated can be increased. Furthermore, with the configuration of Patent Document 9, it is difficult to form a wire-shaped organic EL device by forming plural kinds of thin films on a wire.

In the molten metal discharging apparatus disclosed in Patent Document 6, it is difficult to form minute bumps though a desired amount of solder can be discharged in a short time. In the interconnection forming apparatus disclosed in Patent Document 10, it is difficult to form a uniform, minute, three-dimensional interconnection on the surface of for example, a substrate having level difference portions though conductive particles can be focused so as to have a desired beam diameter.

In view of the above, the present invention provides a resist film forming apparatus and method that employ an electrostatic spraying device capable of forming a uniform thin film on a work. The invention also provides a conductive film forming apparatus and method, a short-wavelength, high-transmittance insulative film forming apparatus and method, a phosphor film forming apparatus and method, an insulating film forming apparatus and method, and a liquid agent synthesizing apparatus and method that employ such an electrostatic spraying device.

The invention also provides a resin molding apparatus and method in which a cleaning process is facilitated.

Furthermore, the invention provides a thin-film forming apparatus for forming a uniform thin film on a wire and a minute organic EL device that uses a wire.

Still further, the invention provides a bump forming apparatus and method for forming minute bumps on a work, an interconnection forming apparatus and method for forming uniform, minute interconnections on a work. The invention also provides a wiring structural body having a wiring structure in which such bumps or interconnections are formed.

Means for Solving the Problems

A resist film forming apparatus according to one aspect of the invention is a resist film forming apparatus which forms a resist film on a substrate by electrostatic spraying, and comprises a nozzle which sprays particles of a liquid agent as ingredients of the resist film toward the substrate having level difference portions when a prescribed voltage is applied to the nozzle; a driver which moves the substrate or the nozzle relatively, and a controller which performs a control so as to form the resist film on the substrate having the level difference portions using the particles of the liquid agent.

A resist film forming apparatus according to another aspect of the invention is a resist film forming apparatus which forms a resist film on a semiconductor chip having bumps by electrostatic coating, and comprises a nozzle which coats the semiconductor chip with particles of a liquid agent as ingredients of the resist film when a prescribed voltage is applied to the nozzle; a driver which moves the semiconductor chip or the nozzle relatively; and a controller which performs a control so as to form the resist film on the semiconductor chip having the bumps selectively around the bumps excluding top surfaces of the bumps using the particles of the liquid agent.

A resist film forming method according to another aspect of the invention is a resist film forming method for forming a resist film on a substrate by electrostatic spraying, and comprises the steps of applying a prescribed voltage to a nozzle; spraying particles of a liquid agent as ingredients of the resist film toward the substrate having level difference portions; and forming the resist film on the substrate having the level difference portions using the particles of the liquid agent.

A resist film forming method according to another aspect of the invention is a resist film forming method for forming a resist film on a substrate by electrostatic coating, and comprises the steps of applying a prescribed voltage to a nozzle; coating the substrate with particles of a liquid agent as ingredients of the resist film; and forming the resist film on the substrate using the particles of the liquid agent.

A conductive film forming apparatus according to another aspect of the invention is a conductive film forming apparatus which forms a conductive film for electromagnetic shielding on a work by electrostatic spraying or electrostatic coating, and comprises a nozzle which sprays or applies particles of a liquid agent as ingredients of the conductive film toward or to the work when a prescribed voltage is applied to the nozzle; a driver which moves the work or the nozzle relatively and a controller which performs a control so as to form the conductive film on the work using the particles of the liquid agent.

A conductive film forming method according to another aspect of the invention is a conductive film forming method for forming a conductive film for electromagnetic shielding on a semiconductor package by electrostatic spraying or electrostatic coating, and comprises the steps of applying a prescribed voltage to a nozzle; spraying or applying particles of a liquid agent as ingredients of the conductive film from the nozzle toward or to the semiconductor package; and forming the conductive film on the semiconductor package using the particles of the liquid agent.

A short-wavelength, high-transmittance insulative film forming apparatus according to another aspect of the invention is a short-wavelength, high-transmittance insulative film forming apparatus which forms a short-wavelength, high-transmittance insulative film on a work by electrostatic spraying or electrostatic coating, and comprises a liquid agent producing unit which produces a liquid agent by dispersing particles as ingredients of the short-wavelength, high-transmittance insulative film in a solvent a nozzle which sprays or applies the liquid agent toward or to the work when a prescribed voltage is applied to the nozzle; a driver which moves the work or the nozzle relatively, and a heating unit which forms the short-wavelength, high-transmittance insulative film on the work by melting the liquid agent by heating it at a prescribed temperature.

A short-wavelength, high-transmittance insulative film forming method according to another aspect of the invention is a short-wavelength, high-transmittance insulative film forming method for forming a short-wavelength, high-transmittance insulative film on a work by electrostatic spraying or electrostatic coating, and comprises the steps of producing a liquid agent by dispersing particles as ingredients of the short-wavelength, high-transmittance insulative film in a solvent; applying a prescribed voltage to a nozzle; spraying or applying the liquid agent from the nozzle toward or to the work; and forming the short-wavelength, high-transmittance insulative film on the work by melting the liquid agent by heating it at a prescribed temperature.

A phosphor film forming apparatus according to another aspect of the invention is a phosphor film forming apparatus which forms a phosphor on a work by electrostatic spraying or electrostatic coating, and comprises a nozzle which sprays or applies particles of a liquid agent as ingredients of the phosphor toward or to the work when a prescribed voltage is applied to the nozzle; a driver which moves the work or the nozzle relatively; and a controller which performs a control so as to form the phosphor on the work using the particles of the liquid agent.

A phosphor film forming method according to another aspect of the invention is a phosphor film forming method for forming a phosphor on an LED chip by electrostatic spraying or electrostatic coating, and comprises the steps of applying a prescribed voltage to a nozzle; spraying or applying particles of a liquid agent as ingredients of the phosphor from the nozzle toward or to the LED chip or a component of an LED package (lead frame, reflector, or board); and forming the phosphor on the LED chip using the particles of the liquid agent.

Au insulating film forming apparatus according to another aspect of the invention is an insulating film forming apparatus which forms an insulating film on a work by electrostatic spraying or electrostatic coating, and comprises a nozzle which sprays or applies particles of a liquid agent as ingredients of the insulating film toward or to the work when a prescribed voltage is applied to the nozzle; a driver which moves the work or the nozzle relatively; and a controller which performs a control so as to form the insulating film on the work using the particles of the liquid agent.

Au insulating film forming method according to another aspect of the invention is an insulating film forming method for forming an insulating film on a wire by electrostatic spraying or electrostatic coating, and comprises the steps of applying a prescribed voltage to a nozzle; spraying or applying particles of a liquid agent as ingredients of the insulating film from the nozzle toward or to the wire; and forming the insulating film on the wire using the particles of the liquid agent.

A liquid agent synthesizing apparatus according to another aspect of the invention is a liquid agent synthesizing apparatus which synthesizes a liquid agent by electrostatic spraying or electrostatic coating and forms a film on a work, and comprises a first nozzle to which a negative voltage with respect to the voltage of the work is applied and which sprays or applies a negatively charged first liquid agent; a second nozzle to which a positive voltage with respect to the voltage of the work is applied and which sprays or applies a positively charged second liquid agent; a driver which moves the work or the first nozzle or second nozzle relatively; and a controller which performs a control so as to combine the negatively charged first liquid agent and the positively charged second liquid agent together and forms the film on the work.

A liquid agent synthesizing method according to another aspect of the invention is a liquid agent synthesizing method for synthesizing a liquid agent by electrostatic spraying or electrostatic coating and forming a film on a work, and comprises the steps of applying a negative voltage with respect to the voltage of the work to a first nozzle, and applying a positive voltage with respect to the voltage of the work to a second nozzle; spraying or applying a negatively charged first liquid agent from the first nozzle, and spraying or applying a positively charged second liquid agent from the second nozzle; forming a synthesized liquid agent by combining the first liquid agent and the second liquid agent together, and forming the film on the work using the synthesized liquid agent.

A resin molding apparatus according to another aspect of the invention comprises an electrostatic spraying device which forms a thin film of a release agent on a die by applying a prescribed voltage between a nozzle and the die and thereby spraying the release agent electrostatically from the nozzle toward the die; and a press device which performs resin molding on a work using the die on which the thin film of the release agent is formed.

A resin molding apparatus according to another aspect of the invention comprises a laser device which irradiates a die with laser light; an electrostatic spraying device which forms a thin film of a release agent on a die by applying a prescribed voltage between a nozzle and the die after the irradiation with the laser light and thereby spraying the release agent electrostatically from the nozzle toward the die; and a press device which performs resin molding on a work using the die on which the thin film of the release agent is formed.

A resin molding method according to another aspect of the invention comprises the steps of forming a thin film of a release agent on a die by applying a prescribed voltage between a nozzle and the die and thereby spraying the release agent electrostatically from the nozzle toward the die; clamping a work using the die on which the thin film of the release agent is formed; and performing resin molding by supplying a resin to the work.

A resin molding method according to another aspect of the invention comprises the steps of irradiating a die with laser light; forming a thin film of a release agent on a die by applying a prescribed voltage between a nozzle and the die and thereby spraying the release agent electrostatically from the nozzle toward the die; clamping a work using the die on which the thin film of the release agent is formed; and performing resin molding by supplying a resin to the work.

A thin-film forming apparatus according to another aspect of the invention is a thin-film forming apparatus which forms a thin film on a wire by electrostatic spraying, and comprises a nozzle which sprays a liquid agent as ingredients of the thin film toward the wire from a radial direction of the wire; and a voltage control device which applies a prescribed voltage between the nozzle and the wire, and forms the thin film on the wire by applying the prescribed voltage and thereby spraying the liquid agent from the nozzle toward the wire.

A thin-film forming apparatus according to another aspect of the invention is a thin-film forming apparatus which forms a thin film on a wire by electrostatic spraying, and comprises a first electrostatic spraying device comprising first plural nozzle portions which spray a first liquid agent as ingredients of a first thin film toward the wire from plural directions and a first voltage control device which applies a first voltage between each of the first plural nozzle portions and the wire; a second electrostatic spraying device comprising second plural nozzle portions which spray a second liquid agent as ingredients of a second thin film toward the wire from plural directions and a second voltage control device which applies a second voltage between each of the second plural nozzle portions and the wire; and moving devices which moves the wire, wherein the first voltage control device forms the first thin film on the wire by applying the first voltage and thereby spraying the first liquid agent from the first plural nozzle portions toward the wire; the moving devices moves the wire on which the first thin film is formed to the second electrostatic spraying device; and the second voltage control device forms the second thin film on the wire on which the first thin film is formed by applying the second voltage and thereby spraying the second liquid agent from the second plural nozzle portions toward the wire.

Au organic EL device according to another aspect of the invention comprises an insulative wire; a first electrode formed on the insulative wire in a first region; a light-emitting layer formed on the first electrode of the insulative wire; and a second electrode formed on the light-emitting layer of the insulative wire.

Au organic EL device according to another aspect of the invention comprises an insulative wire which constitutes a first electrode; an insulating layer formed on the insulative wire in a first region; a light-emitting layer formed on the insulative wire in a second region; and a second electrode formed on the insulating layer and the light-emitting layer of the insulative wire.

A bump forming apparatus according to another aspect of the invention is a bump forming apparatus which forms a bump on a work by electrostatic coating, and comprises a nozzle which sprays a liquid agent as ingredients of the bump when a pulse voltage is applied to it; and a controller which performs a control so as to form the bump on the work using the liquid agent.

A bump forming method according to another aspect of the invention is a bump forming method for forming a bump on a work by electrostatic coating, and comprises the steps of applying a pulse voltage between a nozzle and the work; and forming the bump of 3 to 10 µm in diameter on the work by coating the work with a liquid agent as ingredients of the bump at a prescribed position by performing electrostatic coating according to the pulse voltage.

Au interconnection forming apparatus according to another aspect of the invention is an interconnection forming apparatus which forms an interconnection on a work by at least one of electrostatic spraying and electrostatic coating, and comprises a first nozzle which sprays a first liquid agent as first ingredients of the interconnection toward the work when a first voltage is applied to the first nozzle; and a controller which performs a control so as to form the interconnection three-dimensionally on the work using the first liquid agent.

Au interconnection forming method according to another aspect of the invention is an interconnection forming method for forming an interconnection on a work by at least one of electrostatic spraying and electrostatic coating, and comprises the steps of applying a first voltage between a first nozzle and the work; forming an insulating film on the work using a first liquid agent as first ingredients of the interconnection by spraying the first liquid agent toward the work according to the first voltage; applying a second voltage between a second nozzle and the work; and forming a conductive film on the work using a second liquid agent as second ingredients of the interconnection by coating the work with the second liquid agent according to the second voltage.

A wiring structural body according to a further aspect of the invention is a wiring structural body in which a wiring structure of at least one of bumps and interconnections is formed by at least one of electrostatic spraying and electrostatic coating.

Other objects and features of the invention will be described in the following embodiments.

Advantages of the Invention

The invention can provide a resist film forming apparatus and method that employ an electrostatic spraying device capable of forming a uniform thin film on a work. The invention can also provide a conductive film forming apparatus and method, a phosphor film forming apparatus and method, an insulating film forming apparatus and method, and a liquid agent synthesizing apparatus and method that employ such an electrostatic spraying device.

The invention can also provide a resin molding apparatus and method in which a cleaning process is facilitated.

Furthermore, the invention can provide a thin-film forming apparatus for forming a uniform thin film on a wire and a minute organic EL device that uses a wire.

Still further, the invention can provide a bump forming apparatus and method for forming minute bumps on a work, an interconnection forming apparatus and method for forming uniform, minute interconnections on a work. The invention can also provide a wiring structural body in which such bumps or interconnections are formed.

MODES FOR CARRYING OUT THE INVENTION

Figure 1:
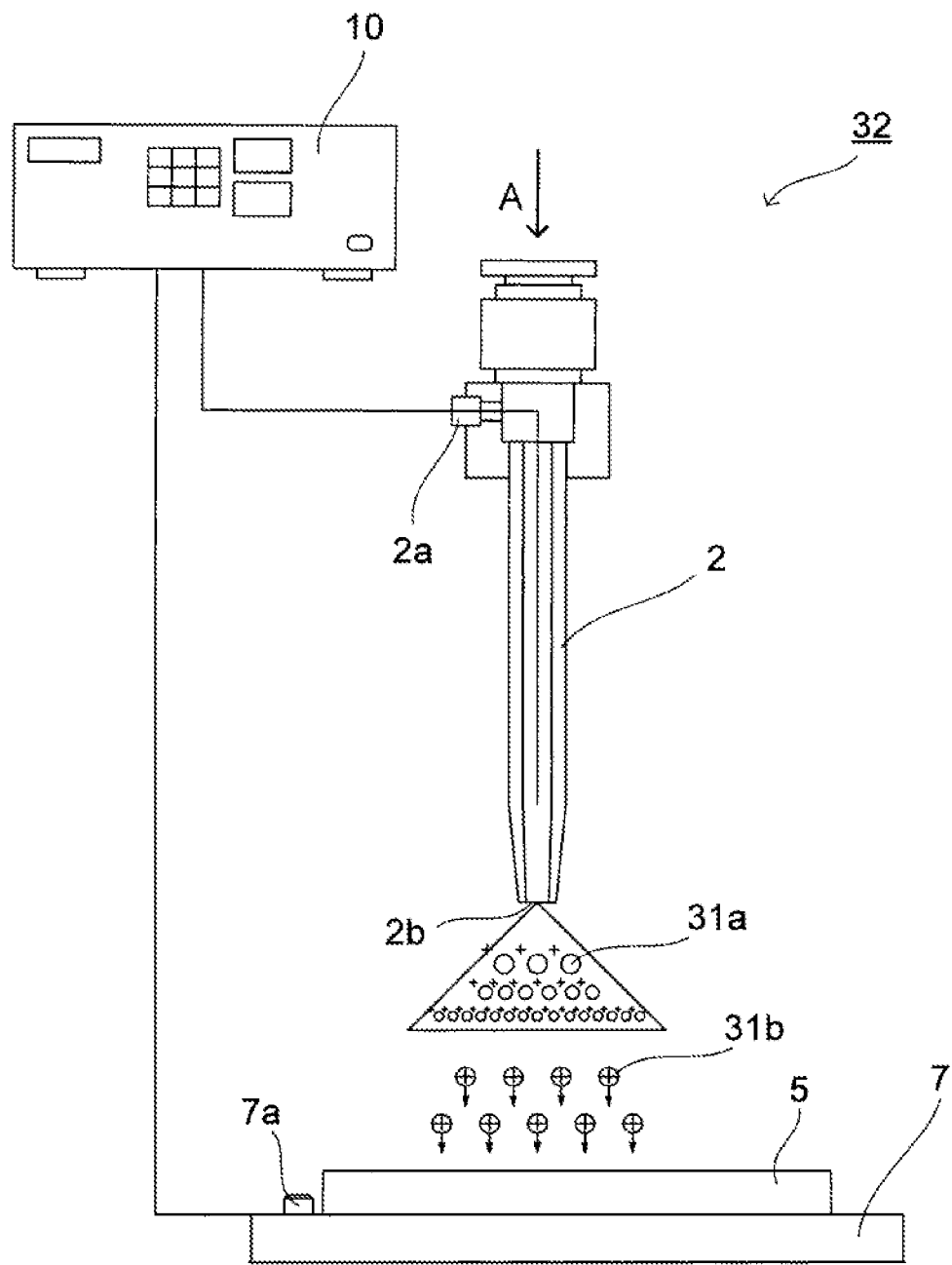
FIG. 1 shows a general configuration of an electrostatic spraying device (electrostatic coating device) employed in Embodiments 1 to 7, 8, 9 and 15.

Embodiments of the present invention will be hereinafter described in detail with reference to the drawings. In the drawings, the same members are given the same reference symbol and redundant descriptions therefor will be avoided.

Embodiment 1

First, electrostatic spraying and electrostatic coating that are common to all of the embodiments of the invention will be outlined with reference to FIG. 1. FIG. 1 shows a general configuration of an electrostatic spraying device 32 employed in the embodiments. The electrostatic spraying device 32 forms a thin film on a target object by electrostatic spraying. The target object is a substrate, a semiconductor chip, a semiconductor package, an LED chip, a wire, or the like, and may be referred to as a work below. In the following, the term "LED chip" may include components (lead frame, reflector, board, lens, etc.) that are part of an LED chip or an LED package. The term "thin film" means a film that is formed on a work by the electrostatic spraying device 32, and is a resist film, a conductive film, a short-wavelength, high-transmittance insulative film, a phosphor, an insulating film, or the like.

The electrostatic spraying device 32 is mainly composed of a nozzle 2, a controller 10, and a table 7 on which a work 5 is to be placed. The controller 10 include a voltage control device for applying a prescribed voltage to the nozzle 2. A liquid agent is supplied to the nozzle 2 from the direction indicated by arrow A in FIG. 1. A proper liquid agent is selected according to the type of a thin film to be formed on the work 5. That is, ingredients of a film to be formed on the work 5 are selected as a liquid agent. The liquid agent is one in which the material of a film to be formed on the work 5 is dissolved, one in which fine particles of the material is dispersed in a solvent or the like, or one in which a complex or precursor of the material exists in a solvent. This also applies to each of the following embodiments.

The controller 10 applies a prescribed voltage between an electrode 2a of the nozzle 2 and an electrode 7a of the table 7. The work 5 is placed on the table 7 so as to be opposed to a tip portion 2b of the nozzle 2 (nozzle tip portion). The diameter (i.e., the inner diameter for passage of a liquid agent) of the nozzle tip portion is set at about 20 to 200 µm, for example.

When the prescribed voltage is applied by the controller 10, a liquid agent is sprayed from the tip portion 2b of the nozzle 2 toward the work 5. Repulsion occurs in the liquid agent that is located inside the nozzle 2 due to the electrostatic force produced by the application voltage, and the liquid agent becomes fine particles against the surface tension of the liquid surface in the tip portion 2b of the nozzle 2. Charged positively or negatively, the fine particles of the liquid agent repel each other and hence can be sprayed without cohering together. Immediately after being sprayed from the tip portion 2b of the nozzle 2, the liquid agent is in the form of particles 31a having relatively large diameters. Then the liquid agent is transformed into particles 31b having relatively small diameters, which are deposited on the work 5. A thin film of the liquid agent is formed on the surface of the work 5 by solidifying the deposited particles 31b (liquid agent).

In the embodiments, the thickness of a film (thin film) formed on the work 5 is about 1 to 5 µm, for example, and a uniform thin film can be formed. The thickness of a film to be formed on the work 5 can be set as appropriate according to its ingredients (i.e., thin film type). As described above, the electrostatic spraying technique according to the embodiments makes it possible to form a thin film that cannot be formed by any background-art spraying techniques. Furthermore, the electrostatic spraying can form a uniform film of the liquid agent on the work 5 even in the case where the work 5 has level difference portions (projections).

Figure 2:
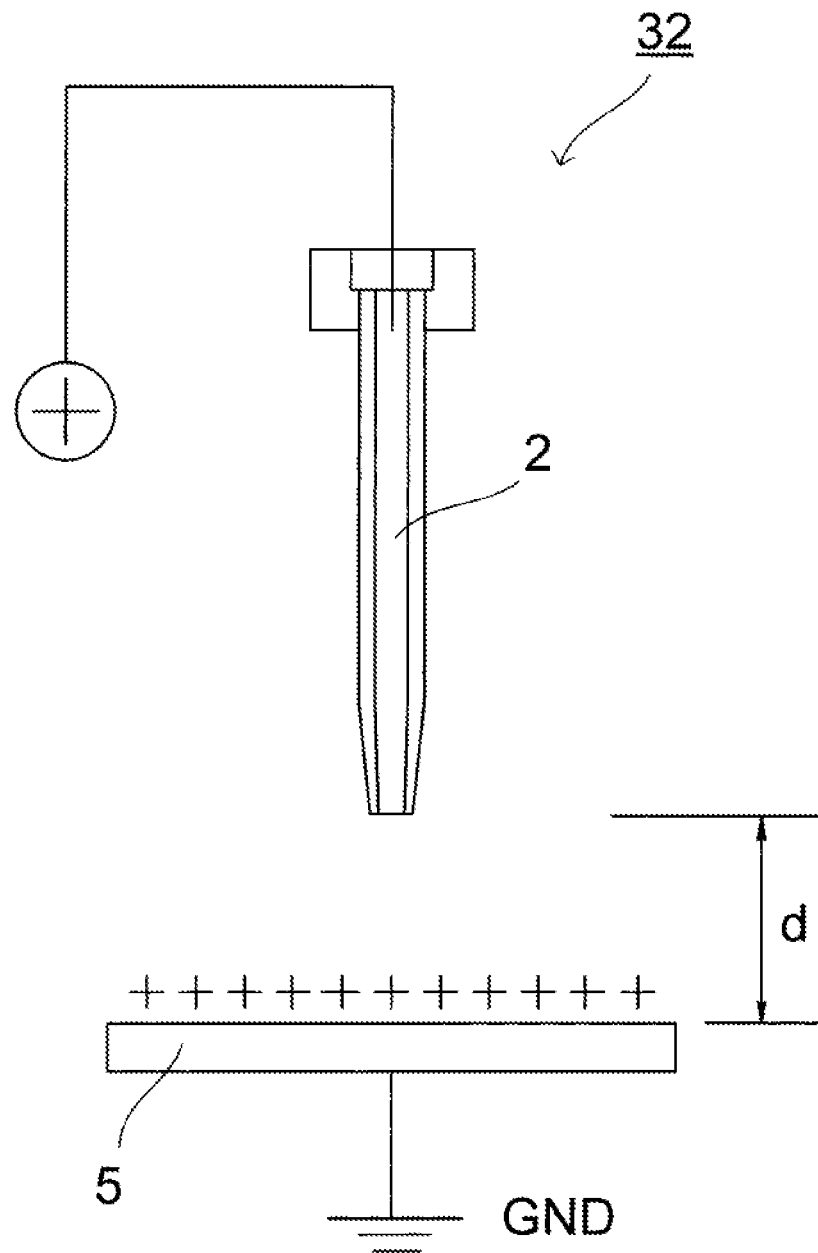
FIG. 2 illustrates a DC voltage that is applied in the electrostatic spraying device (electrostatic coating device) employed in the Embodiments 1 to 7, 8, 9 and 15.
Figure 3A:
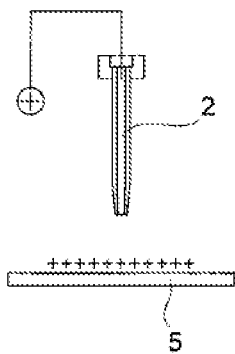
FIGS. 3A to 3C illustrate a pulse voltage that is applied in the electrostatic spraying device (electrostatic coating device) employed in the Embodiments 1 to 7, 8, 9 and 15.
Figure 3B:
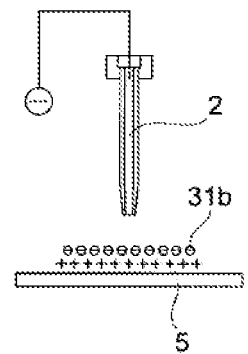
Figure 3C:
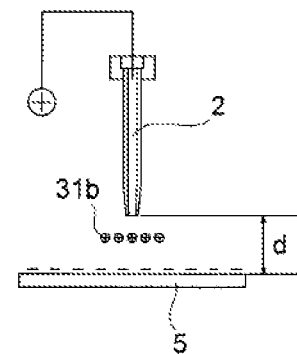

Next, how to generate a voltage to be applied in the electrostatic spraying device 32 (to generate static electricity) will be described with reference to FIGS. 2 and 3A to 3C. FIG. 2 illustrates a DC voltage that is applied in the electrostatic spraying device 32. FIGS. 3A to 3C illustrate a pulse voltage that is applied in the electrostatic spraying device 32.

FIG. 2 shows a state that the work 5 (table 7) is grounded (connected to GND) and a positive (+) DC voltage is applied to the nozzle 2. However, the embodiments are not limited to this case; a negative (−) DC voltage may be applied to the nozzle 2. Whether to use a positive voltage or a negative voltage is set as appropriate according to the materials of the liquid agent and the work 5 and other factors. Since it suffices to apply a voltage of a fixed polarity, the voltage is not limited to a DC voltage; a control may be made so that the magnitude of the voltage is varied during spraying while its polarity is maintained. Furthermore, a pulse voltage may be applied whose magnitude varies between a high level and a low level of a fixed polarity (positive or negative). Where such a pulse voltage is applied, it may either include or not include 0 V. In the embodiments, the distance d between the tip portion 2b of the nozzle 2 and the surface of the work 5 is set at about 0.5 to 20 mm, for example.

In the embodiments, a configuration is possible in which a pulse voltage that takes both of the positive polarity and the negative polarity is applied instead of a DC voltage. In this case, the controller 10 of the electrostatic spraying device 32 applies, to the nozzle 2, a pulse voltage whose polarity with respect to the work 5 (table 7) becomes positive or negative alternately (pulse oscillation is caused). A pulse voltage is used suitably in, for example, a case that the conductivity of the work 5 is low. A pulse voltage is used suitably for a case of forming a thin film selectively on the surface of the work 5. This is because the spraying of a liquid agent from the nozzle 2 can be controlled according to the polarity of a pulse voltage. In the following description, electrostatic spraying using a pulse voltage may be referred to as electrostatic coating.

Where a pulse voltage is applied, first, a positive voltage (+ voltage) is applied to the nozzle 2 as shown in FIG. 3A. At this time, positive charges (+ charges) are accumulated in the surface (nozzle-2-side surface) of the work 5 and this surface is charged positively. Then, as shown in FIG. 3B, a negative voltage (− voltage) is applied to the nozzle 2. At this time, particles 31b sprayed electrostatically from the nozzle 2 are charged negatively and hence stick to (hit) the surface of the work 5 being charged positively. Then, as shown in FIG. 3C, a positive voltage (+ voltage) is applied to the nozzle 2. At this time, particles 31b sprayed electrostatically from the nozzle 2 are charged positively and hence stick to the surface of the work 5. It is possible to perform uniform electrostatic spraying or electrostatic coating on the work 5 by providing mechanisms for moving one or both of the table 7 and the nozzle 2 in the X, Y, and Z directions and moving the table 7 and the nozzle 2 relative to each other in the X, Y, and Z directions.

Particles 31b to constitute a thin film of the liquid agent are deposited on the work 5 by repeatedly establishing the state that the negative voltage is applied (see FIG. 3B) and the state that the positive voltage is applied (see FIG. 3C) (i.e., by applying the pulse voltage). The magnitude of the pulse voltage is set at about 0.5 to 10 kV, for example, and the pulse width (spraying speed) is set so as to correspond to about 5 Hz to 1 kHz, for example. The distance d between the tip portion 2b of the nozzle 2 and the work surface is set at about 0.5 to 20 mm, for example.

Figure 4:
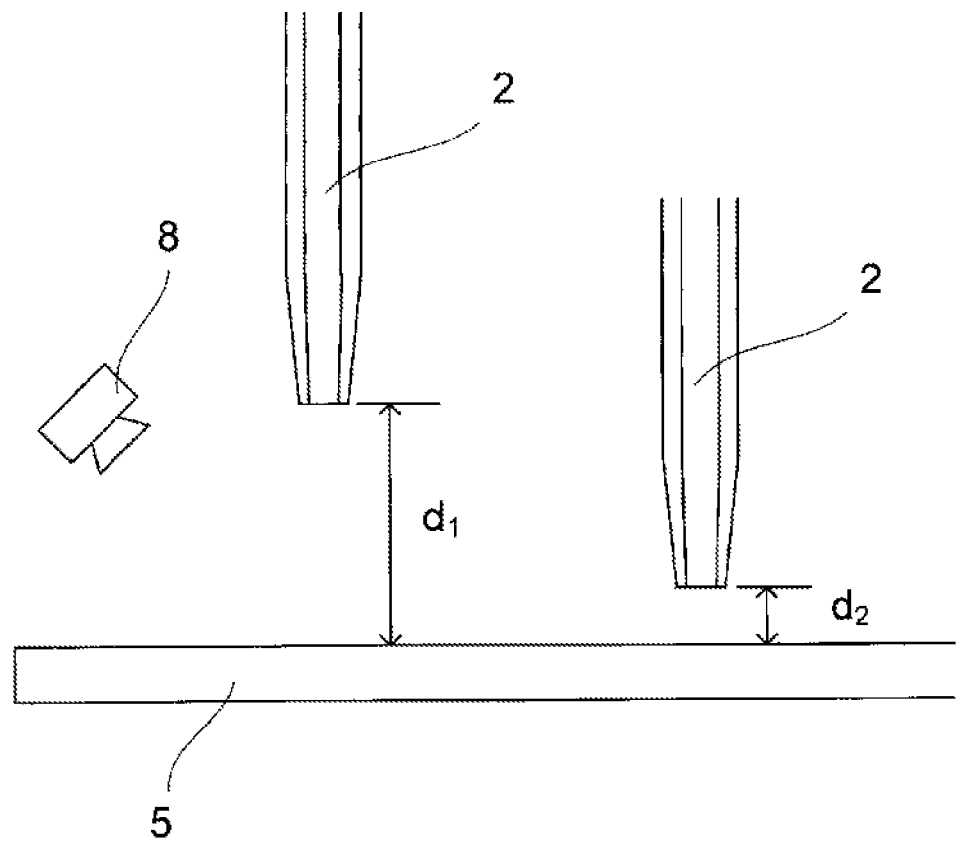
FIG. 4 shows how a nozzle position control is performed in the electrostatic spraying device (electrostatic coating device) employed in the Embodiments 1 to 7, 8, 9 and 15.

In the embodiments, the spraying distance, that is, the position (height) of the nozzle 2, may be controlled to control the particle diameters of particles 31b that reach the work 5. The nozzle 2 may be provided with a vertical moving mechanism. A configuration may be employed in which the table 7 is provided with a similar mechanism to enable a change of the relative height. FIG. 4 shows how a position control (height control) is performed on the nozzle 2 (nozzle tip portion) in the electrostatic spraying device 32. As shown in FIG. 4, the electrostatic spraying device 32 is equipped with a camera 8 which is disposed so as to be able to observe particles 31b that have reached the surface of the work 5. Particle diameters or a coating state of particles 31b is thus observed using the camera 8, and a control is performed so as to move the nozzle 2 to a desired position according to an observation result. For example, as shown in FIG. 4, it is possible to change the distance between the nozzle tip portion and the surface of the work 5 from d1 to d2 during spraying.

Such a control can be performed automatically through image processing or manually. The method for controlling particle diameters is not limited to changing the height or the position in the left-right direction of the nozzle 2; for example, a configuration may be employed in which the nozzle diameter, the magnitude or pulse width of an application voltage is changed. This control is effective in the case where the electrostatic characteristic of the work 5 varies while a thin film of a liquid agent is being formed on the work 5.

In the embodiments, a configuration is possible in which the nozzle 2 is equipped with plural nozzle portions. In this case, to place a liquid agent uniformly on the work 5, voltages (pulse voltages) that are applied to the plural respective nozzle portions may be controlled independently of each other. The arrangement of the plural nozzle portions may be varied from one prescribed region to another. Setting magnitudes of voltages makes it possible to form a thin film of a liquid agent with a more uniform thickness distribution.

Figure 5A:
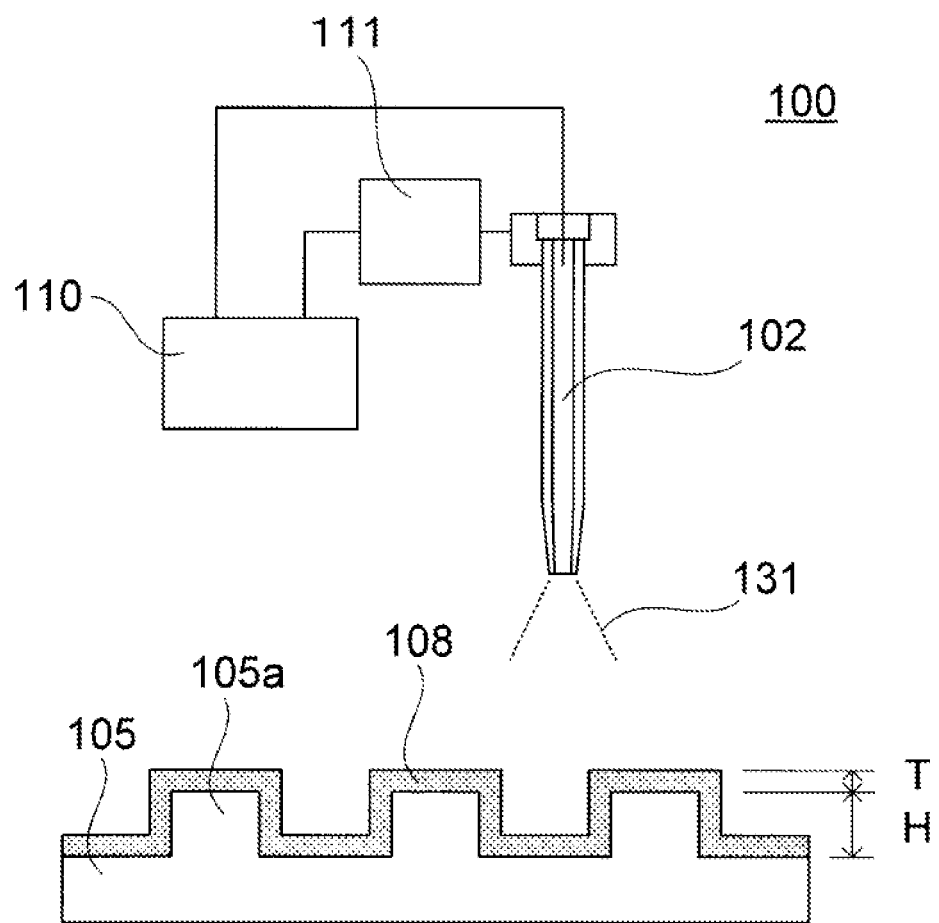
FIG. 5A illustrates a resist film forming method according to Embodiment 1 which utilizes electrostatic spraying.

Next, Embodiment 1 of the invention will be described with reference to FIG. 5A. FIG. 5A, which illustrates a resist film forming method according to this embodiment, shows how to form a resist film on a substrate having level difference portions. This embodiment relates to a resist film forming method and utilizes the above-described electrostatic spraying method (electrostatic coating method). It is noted that the embodiment is also directed to a resist film forming apparatus 100 for performing the resist film forming method. The resist film forming apparatus 100 according to the embodiment is configured so as to form a uniform resist film on a substrate having level difference portions.

As shown in FIG. 5A, a substrate 105 is formed with level difference portions 105a. The height of the level difference portions 105a is 10 to 100 μm, for example. However, the embodiment is not limited to such a case, and can also be applied to level difference portions whose height is out of the above range and level difference portions having a more complex shape. The resist film forming apparatus 100 has a nozzle 102 for spraying a liquid agent (particles 131) as ingredients of a resist film when a prescribed voltage is applied to it by a controller 110 which includes a voltage control device. The nozzle 102 may be configured so as to be equipped with plural nozzle portions (multi-nozzle configuration). The resist film forming apparatus 100 has a driver 111 for moving the nozzle 102 relative to the substrate 105. The driver 111 may be configured so as to move the substrate 105 relative to the nozzle 102. In either configuration, the driver 111 can move the substrate 105 or the nozzle 102 relatively, more specifically, in the in-plane directions and the height direction (XYZ movements).

In the resist film forming apparatus 100 having the above configuration, a uniform resist film can be formed on both of the top surfaces and the side surfaces of the level difference portions 105a by spraying a liquid agent (ingredients of the resist film) over the substrate 105 by utilizing the above-described electrostatic spraying.

Although the thickness T of a resist film 108 is 5 μm, for example, the embodiment is not limited to such a case. When it is attempted to form a resist film using background-art spin coating in a case that a substrate (target object) has level difference portions, it is difficult to form a uniform resist film, that is, the resist film has thin portions and thick portions in mixed form around the level difference portions. The resist film forming method according to the embodiment makes it possible to form a uniform resist film on a substrate having level difference portions.

To form a uniform resist film on the substrate 105 having the level difference portions 105a as shown in FIG. 5A, it is preferable that the controller 110 perform electrostatic spraying by applying a prescribed DC voltage between the nozzle 102 and the substrate 105. However, if necessary, electrostatic spraying (electrostatic coating) may be performed by applying a pulse voltage.

In the embodiment, a resist film is formed on the substrate 105 by the above-described electrostatic spraying. To this end, it is preferable that the controller 110 perform electrostatic spraying by applying a voltage between the nozzle 102 and the substrate 105. However, if necessary, electrostatic coating may be performed by applying a pulse voltage between the nozzle 102 and the substrate 105.

In the basic concept of Embodiment 1, the object to be sprayed, the object to be coated, the solvent (liquid agent), the dispersed substance, and the thin-film state are not limited to the examples described above. Cases that employ other examples will be described individually in detail in Embodiments 8, 9 and 15.

Embodiment 2

Figure 5B:
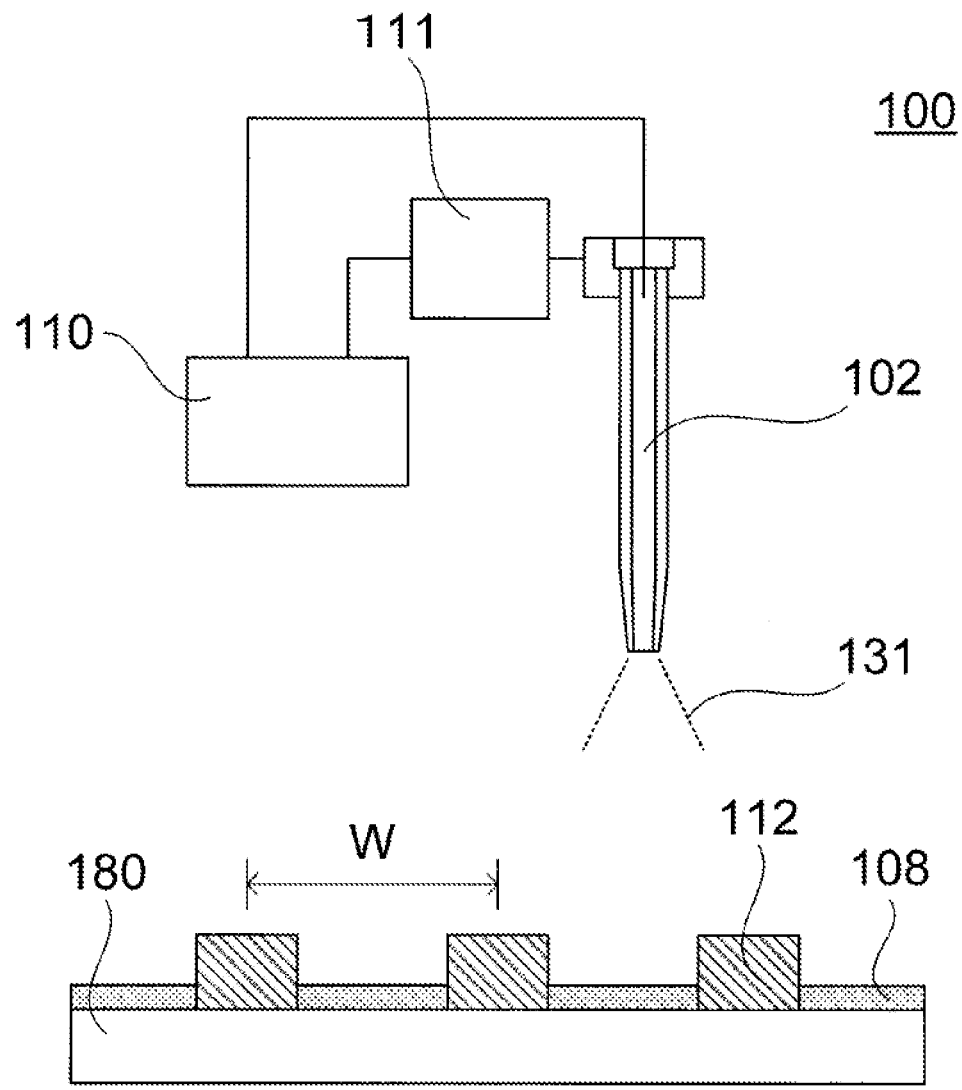
FIG. 5B illustrates a resist film forming method according to Embodiment 2 which utilizes electrostatic spraying.

Next, Embodiment 2 of the invention will be described with reference to FIG. 5B. FIG. 5B, which illustrates a resist film forming method according to this embodiment, shows how to form a resist film between plural bumps. This embodiment relates to a resist film forming method and utilizes the same electrostatic spraying method or electrostatic coating method as described in Embodiment 1. It is noted that the embodiment is also directed to a resist film forming apparatus 100 for performing the resist film forming method. The resist film forming apparatus 100 according to the embodiment is configured so as to form a resist film selectively between plural bumps (i.e., in regions other than head portions of the bumps).

As in Embodiment 1, the resist film forming apparatus 100 has a nozzle 102 for spraying a liquid agent (particles 131) as ingredients of a resist film when a prescribed voltage is applied to it by a controller 110 which includes a voltage control device. The nozzle 102 may be configured so as to be equipped with plural nozzle portions (multi-nozzle configuration). The resist film forming apparatus 100 has a driver 111 capable of moving a semiconductor chip 180 or the nozzle 102 relatively, more specifically, moving it in the in-plane directions and the height direction (XYZ movements). In the embodiment, it need not always be moved in all of the X, Y, and Z directions; for example, where a Z movement is not necessary, the driver 111 may be configured so as to enable only X and Y movements. Although the thickness T of a resist film 108 is 5 μm, for example, the embodiment is not limited to such a case. Kinds of works other than the semiconductor chip 180 may be used.

As shown in FIG. 5B, plural bumps 112 are formed on the semiconductor chip 180. In this situation, the resist film forming apparatus 100 according to the embodiment can cover regions other than head portions (tip portions) of the bumps 112 by electrostatic spraying or electrostatic coating while leaving the head portions as they are, that is, enables partial coating without using a mask. Although the distance W between the adjoining bumps 112 is typically 10 to 100 μm, for example, the embodiment is not limited to such a case.

In the embodiment, a resist film is formed selectively on the semiconductor chip 180 by the above-described electrostatic spraying or electrostatic coating. To this end, it is preferable that the controller 110 perform electrostatic coating by applying a pulse voltage between the nozzle 102 and the semiconductor chip 180. The use of a pulse voltage makes it easier to control an operation of coating a resist film according to the polarity of an application voltage. However, if necessary, electrostatic spraying may be performed by applying a DC voltage between the nozzle 102 and the semiconductor chip 180.

Embodiment 3

Figures 6, 7:
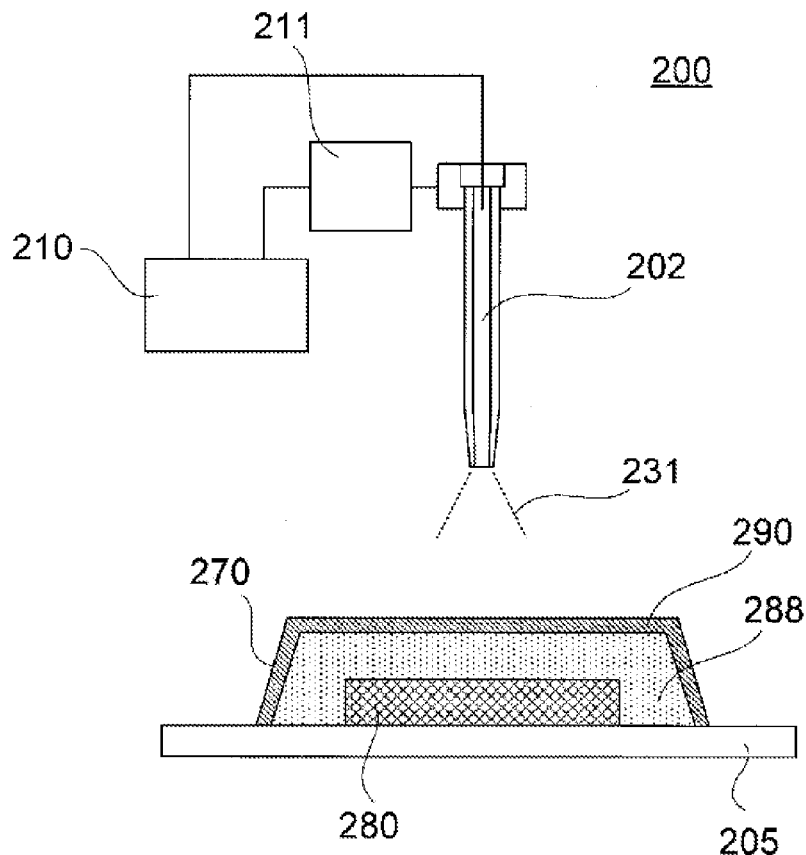
FIG. 6 illustrates a conductive film forming method according to Embodiment 3 which utilizes electrostatic spraying.
FIG. 7 is a table comparing a short-wavelength, high-transmittance insulative film (PTFE film) formed by electrostatic spraying according to Embodiment 4 and a PTFE film formed by background-art dropping.

Next, Embodiment 3 of the invention will be described with reference to FIG. 6. FIG. 6 illustrates a conductive film forming method according to this embodiment and outline a conductive film forming apparatus 200. This embodiment particularly relates to a method for forming a conductive film for electromagnetic shielding and utilizes the above-described electrostatic spraying method. It is noted that the embodiment is also directed to a conductive film forming apparatus 100 for performing the conductive film forming method.

As shown in FIG. 6, the conductive film forming apparatus 200 has a nozzle 202 for spraying a liquid agent (particles 231) as ingredients of a conductive film when a prescribed voltage is applied to it by a controller 210 which includes a voltage control device. In the embodiment, the liquid agent as ingredients of a conductive film is a liquid agent that includes Ni, Cu, Ag, or the like in a solvent. The conductive film forming apparatus 200 has a driver 211 for moving the nozzle 202 in the X, Y, and Z directions relative to a board 205. Instead, a driver may be provided that moves the board 205 in the X, Y, and Z directions relative to the nozzle 202. In either configuration, the board 205 or the nozzle 202 can be moved relatively in the X, Y, and Z directions (i.e., in the in-plane directions and the height direction).

In a work (e.g., semiconductor package) 270, a semiconductor chip 280 is mounted on the board 205. The semiconductor chip 280 is sealed in by a resin 288. The conductive film forming apparatus 200 according to the embodiment is used for giving electromagnetic shielding to such a work (e.g., semiconductor package) 270 by forming a conductive film 290 of Ni, Cu, Ag, or the like on it by electrostatic spraying or electrostatic coating. Such electromagnetic shielding can prevent leakage of electromagnetic waves from the work (e.g., semiconductor package) 270 and protect the work 270 from electromagnetic waves.

Although in FIG. 6 the conductive film 290 is a single film, the embodiment is not limited to such a case; for example, a conductive film of multiple (two or more) layers may be formed by electrostatic spraying. A conductive film having a two-layer structure may include films of either the same kind or different kinds (first conductive film and second conductive film). For example, an Ni film and a Cu film are formed as a first-layer conductive film (first conductive film) and a second-layer conductive film (second conductive film), respectively. Furthermore, there may be formed a multi-layer conductive film which includes a first conductive film and plural conductor films that are different from the first conductive film.

According to the embodiment, a conductive film can be formed partially unlike in the case of plating by forming a conductive film on a work (e.g., semiconductor package) by electrostatic spraying. Furthermore, a conductive film can be formed after mounting of a work (e.g., semiconductor package) on a board. Still further, the size of a work (e.g., semiconductor package) and the film thickness of a conductive film that is necessary for electromagnetic shielding can be set freely. It is noted that the embodiment can be applied to not only the case of forming a conductive film for electromagnetic shielding but also a case of forming a conductive film for another purpose.

A conductive film (electromagnetic shield resin) similar to the one formed according to the embodiment can also be formed by double molding (e.g., compression molding or transfer molding using dies) in which an ordinary work (e.g., semiconductor package) is subjected to primary resin molding using an ordinary resin not containing paste and then to molding using an epoxy resin containing silver paste. Furthermore, electrostatic spraying or electrostatic coating can be performed on not only a resin package but also a ceramic package.

Embodiment 4

Next, Embodiment 4 of the invention will be described. This embodiment is directed to an example method for forming a short-wavelength, high-transmittance insulative film in which a short-wavelength, high-transmittance insulative film (PTFE film) having a thickness of 2 μm or smaller, for example, is formed by electrostatic spraying or electrostatic coating of a liquid agent containing polytetrafluoroethylene (PTFE) which is a fluororesin. The transmittance can be increased by forming a thin PTFE film.

That is, the embodiment relates to a short-wavelength, high-transmittance insulative film forming apparatus for forming a short-wavelength, high-transmittance insulative film (PTFE film) on a work (e.g., LED chip) by electrostatic spraying or electrostatic coating. The short-wavelength, high-transmittance insulative film forming apparatus has a liquid agent producing unit, an electrostatic spraying unit, a heat-melting unit, and a controller (none of which are shown). First, the liquid agent producing unit produces a liquid agent by dispersing, in a solvent, particles as ingredients of a short-wavelength, high-transmittance insulative film (PTFE film). Then the electrostatic spraying unit performs electrostatic spraying or electrostatic coating of this liquid agent by applying a prescribed voltage between a nozzle and a work. Subsequently, the heat-melting unit heat-melts the liquid agent deposited on the work by the electrostatic spraying or electrostatic coating. In this manner, a thin short-wavelength, high-transmittance insulative film (PTFE film) can be formed (i.e., thinning of such a film is enabled). The controller controls the operations of the respective components.

By executing the above process in which electrostatic spraying is performed by dissolving PTFE particles in a solvent and then the resulting liquid agent is heat-melted at a high temperature, a high-quality, thin short-wavelength, high-transmittance insulative film (PTFE film) can be formed without changing the PTFE composition. On the other hand, in a background-art, a PTFE film is formed by dropping a liquid agent containing PTFE particles. The resulting PTFE film is thick and has a low transmittance.

FIG. 7 is a table comparing a PTFE film formed by electrostatic spraying according to the embodiment and a PTFE film formed by background-art dropping. As seen from FIG. 7, for each of particle diameters 300 nm and 3 μm, the film thickness (thickness of the PTFE film) is smaller in the case of electrostatic spraying. Furthermore, the transmittance of light having a short wavelength 250 nm is higher in the case of electrostatic spraying than in the case of dropping. For example, for the particle diameter (particle diameter of the PTFE film) 300 nm, the film thickness of the PTFE film formed by the electrostatic spraying is as small as 0.7 μm whereas that of the PTFE film formed by the dropping is as large as 4 μm. For the same particle diameter, the transmittance of the PTFE film formed by the electrostatic spraying is as high as 75% whereas that of the PTFE film formed by the dropping is as low as 27%. The film thickness values shown in FIG. 7 are ones measured by a coordinate measuring apparatus.

As described above, according to the embodiment, a thin short-wavelength, high-transmittance insulative film (PTFE film) that exhibits a high transmittance for short-wavelength light can be formed by utilizing electrostatic spraying or electrostatic coating. A short-wavelength, high-transmittance insulative film (PTFE film) of the embodiment is formed on the surface of an ultraviolet light-emitting diode (LED) chip, for example. This makes it possible to emit ultraviolet light (which has a short wavelength) efficiently. This method can be selected as a short-wavelength, high-transmittance insulative film forming method with the work not restricted to an LED chip and with the liquid agent material not restricted to PTFE.

Embodiment 5

Figure 8A:
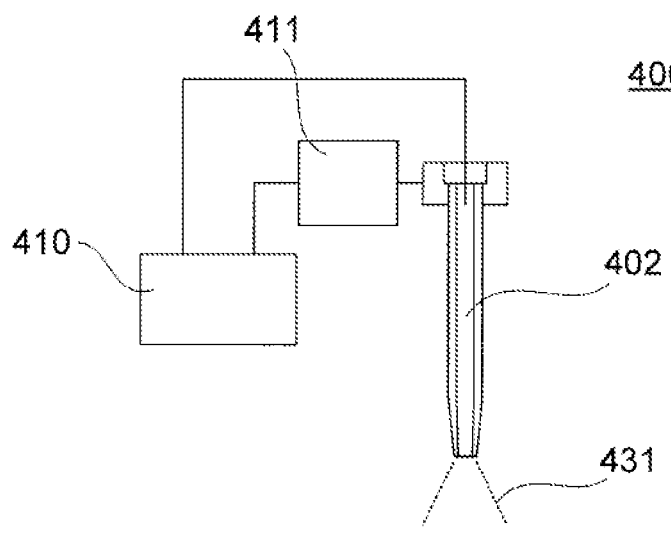
FIGS. 8A and 8B illustrate a phosphor film forming method according to Embodiment 5 which utilizes electrostatic spraying.

Next, Embodiment 5 of the invention will be described with reference to FIGS. 8A and 8B. FIG. 8A illustrates a phosphor film forming method according to this embodiment and outlines a phosphor film forming apparatus 400. This embodiment relates to a phosphor film forming method and a method for forming a phosphor film on a work (e.g., LED chip), and utilizes the above-described electrostatic spraying or electrostatic coating method. The embodiment is also directed to a film forming apparatus for performing the phosphor film forming method.

As shown in FIG. 8A, a phosphor film forming apparatus 400 has a nozzle 402 for spraying a liquid agent (particles 431) as ingredients of a phosphor when a prescribed voltage is applied to it by a controller 410 which includes a voltage control device. In the embodiment, the liquid agent as ingredients of a phosphor is a silicone resin containing a phosphor, a material obtained by adding a solvent to a silicone resin containing a phosphor, a material including only a phosphor and a solvent, or the like. A driver 411 moves the nozzle 402 relative to a board 405. Instead, a driver may be provided that moves the board 405 relative to the nozzle 402. In either configuration, the board 405 or the nozzle 402 can be moved relatively (in the in-plane directions and the height direction).

An LED chip 480 is placed in the phosphor film forming apparatus 400 in a state that it is mounted on the board 405. When a prescribed voltage is applied to the nozzle 402, it sprays particles 431 toward the LED chip 480, whereby a phosphor 485 (a silicone resin containing a phosphor) is formed on the LED chip 480.

In a back ground art, an LED chip is coated with a silicone resin containing a phosphor by a dispenser. However, in this case, it is difficult to form a uniform thin film stably. This may cause an event that light emitted from the LED chip has color unevenness, that is, the LED chip cannot emit high-quality light stably. This necessitates after-emission sorting before shipment. In view of this, in the embodiment, fine particles (particles 431) of about 1 µm are sprayed toward the LED chip 480 by electrostatic spraying (electrostatic coating) using a pulse voltage in the manner as described above with reference to FIGS. 3A to 3C.

As a result, a uniform thin film of a silicone resin (phosphor 485) containing a phosphor can be formed on the LED chip 480. A film of only a phosphor (without a silicone resin) may be formed by electrostatic spraying. More specifically, in the embodiment, a thin film that is about two to three times as thick as the particle diameter can be formed. For example, when the particle diameter (diameter of particles 431) is 20 µm, a film (phosphor 485) having a thickness of about 50 µm is formed.

In the embodiment the phosphor 485 (phosphor film) is used to manufacture a white LED in a simulated manner through wavelength conversion of light emitted from the LED chip 480 and is formed (coated) on the top surface and all the side surfaces (circumferential surfaces) of the LED chip 480. The LED chip 480 is a blue light-emitting device, for example, and a yellow phosphor can produce white light by converting blue light. Since electrostatic spraying is utilized, a uniform thin film can be formed stably on not only the top surface of the LED chip 480 but also its side surfaces. This makes it possible to provide a more efficient LED device (LED package). The embodiment is not limited to the case of coating all the surfaces of the LED chip 480 with the phosphor 485, the phosphor 485 may be formed on only part of its surfaces (e.g., only the top surface or the top surface and part of the side surfaces).

Figure 8B:
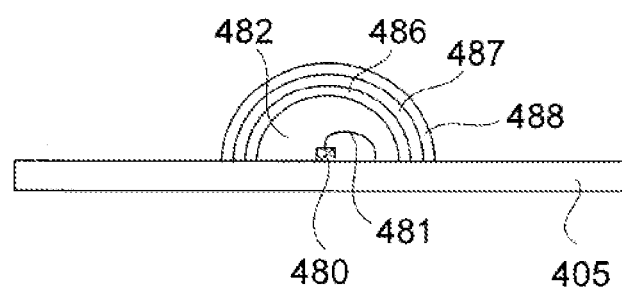

FIG. 8B is a schematic sectional view of an LED device (LED package) manufactured by another mode of the embodiment. As shown in FIG. 8B, an LED chip 480 (light-emitting device) is mounted on a board 405 and wires 481 are bonded to it. The LED chip 480 and the wires 481 are sealed in by a transparent resin 482.

In the embodiment, a phosphor 486 (first phosphor film) is formed on the transparent resin 482 by the above-described electrostatic spraying or electrostatic coating. A phosphor 487 (second phosphor film) is formed on the surface of the phosphor 486. A transparent coating 488 made of a silicone resin, PTFE, or the like is formed on the surface of the phosphor 487. A prescribed wavelength can be obtained by laying the different kinds of phosphors 486 and 487 and subjecting light emitted from the LED chip 480 to plural times of wavelength conversion. It is possible to lay three or more kinds of phosphors one on another.

As described above, the embodiment makes it possible to emit high-quality light stably by forming a phosphor or a layered structure of phosphors on an LED chip. It is noted that an LED device can be manufactured by using, in a composite manner, a phosphor and a layered structure of phosphors formed according to the embodiment.

Embodiment 6

Next, Embodiment 6 of the invention will be described with reference to FIGS. 9A and 9B. This embodiment relates to an insulating film forming method and utilizes the above-described electrostatic spraying method. The embodiment is also directed to an insulating film forming apparatus for performing the insulating film forming method.

Figure 9A:
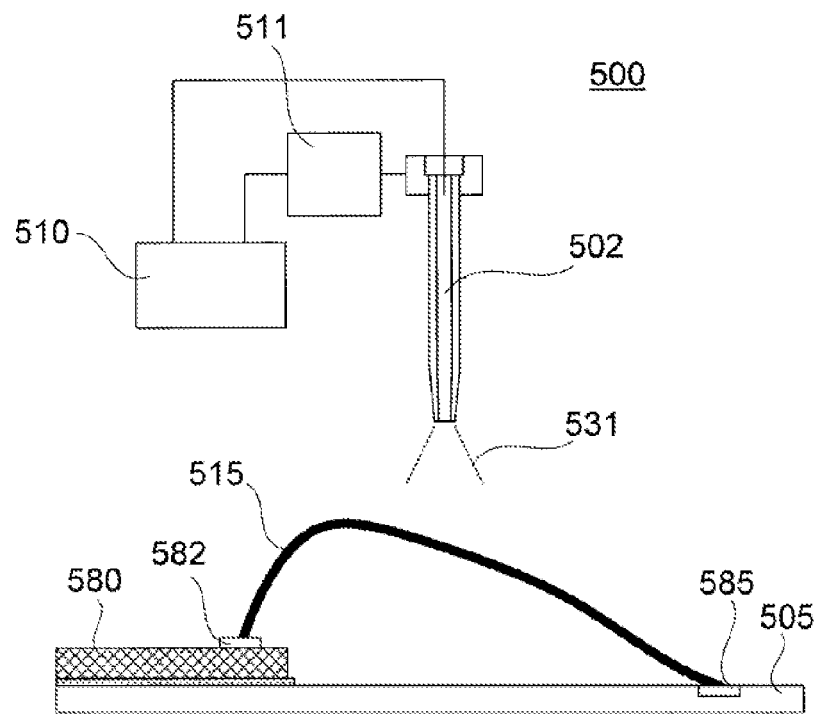
FIGS. 9A and 9B illustrates an insulating film forming method according to Embodiment 6 which utilizes electrostatic spraying.
Figure 9B:
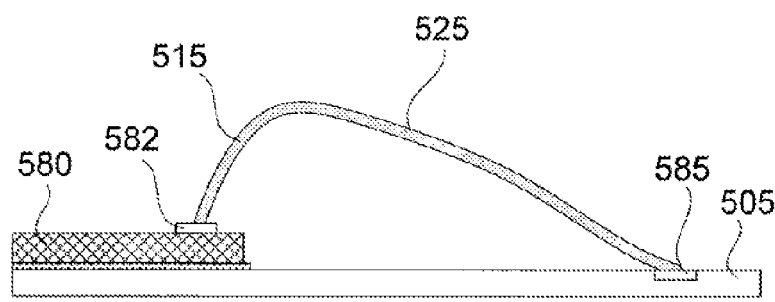

FIGS. 9A and 9B illustrate the insulating film forming method according to the embodiment; FIG. 9A shows a state before formation (coating) of an insulating film on a work (a wire as an example) and FIG. 9B shows a state after formation of the insulating film on the wire. Au insulating film forming apparatus 500 according to the embodiment is configured so as to coat, with an insulating film, a wire 515 (bonding wire) made of such a metal as gold, silver, tungsten, or aluminum.

As shown in FIG. 9A, a semiconductor chip 580 is mounted on a board 505 and a pad 582 (electrode portion) on the semiconductor chip 580 and a pad 585 (electrode portion) on the board 505 are connected to each other by a wire 515. In the insulating film forming apparatus 500 according to the embodiment, a liquid agent (particles 531) as ingredients (insulating material) of an insulating film is sprayed from a nozzle 502 toward the wire 515 by the above-described electrostatic spraying method.

A driver 511 moves the nozzle 502 relative to the board 505. Instead, a driver may be provided that moves the board 505 relative to the nozzle 502. In either configuration, the board 505 or the nozzle 502 can be moved relatively (in the in-plane directions and the height direction).

A controller 510 including a voltage control device can coat the wire 515 (i.e., form an insulating film on the wire 515) properly (see FIG. 9B) by spraying a liquid agent (particles 531) from the nozzle 502 while controlling the polarity and magnitude of an application voltage, the movement speed of the nozzle 502, and other parameters. The insulating material is a polyimide resin, an epoxy resin, enamel, or the like (the embodiment is not limited to such a case). As shown in FIG. 9B, the circumferential surface of the wire 515 is coated with an insulating film 525 as a result of completion of the formation of an insulating film on the wire 515 (execution of the insulating film forming method).

According to the embodiment, a highly reliable, thin insulating film can be formed on a wire by spraying a liquid agent (particles 531) as ingredients of the insulating film on the wire. This makes it possible to wire short-circuiting. During the electrostatic spraying, the insulating material (particles 531) is charged positively or negatively according to the polarity of the voltage applied to the nozzle 502. Therefore, the particles 531 as the insulating material are attracted by the wire 515 which is made of a metal. This makes it possible to suppress the phenomenon that the insulating material flies to regions (e.g., the board surface) whose insulation is not intended.

The insulating film forming apparatus according to the invention can also be used as a metal film forming apparatus for forming a metal film (plating film) instead of an insulating film. In this case, for example, a Cu film can be formed on a tungsten wire or a proper metal film can be formed on a copper (Cu) wire.

Embodiment 7

Next, Embodiment 7 of the invention will be described with reference to FIG. 10. This embodiment relates to a liquid agent synthesizing method and utilizes the above-described electrostatic spraying method. The embodiment is also directed to a liquid agent synthesizing apparatus for performing the liquid agent synthesizing method.

Figure 10:
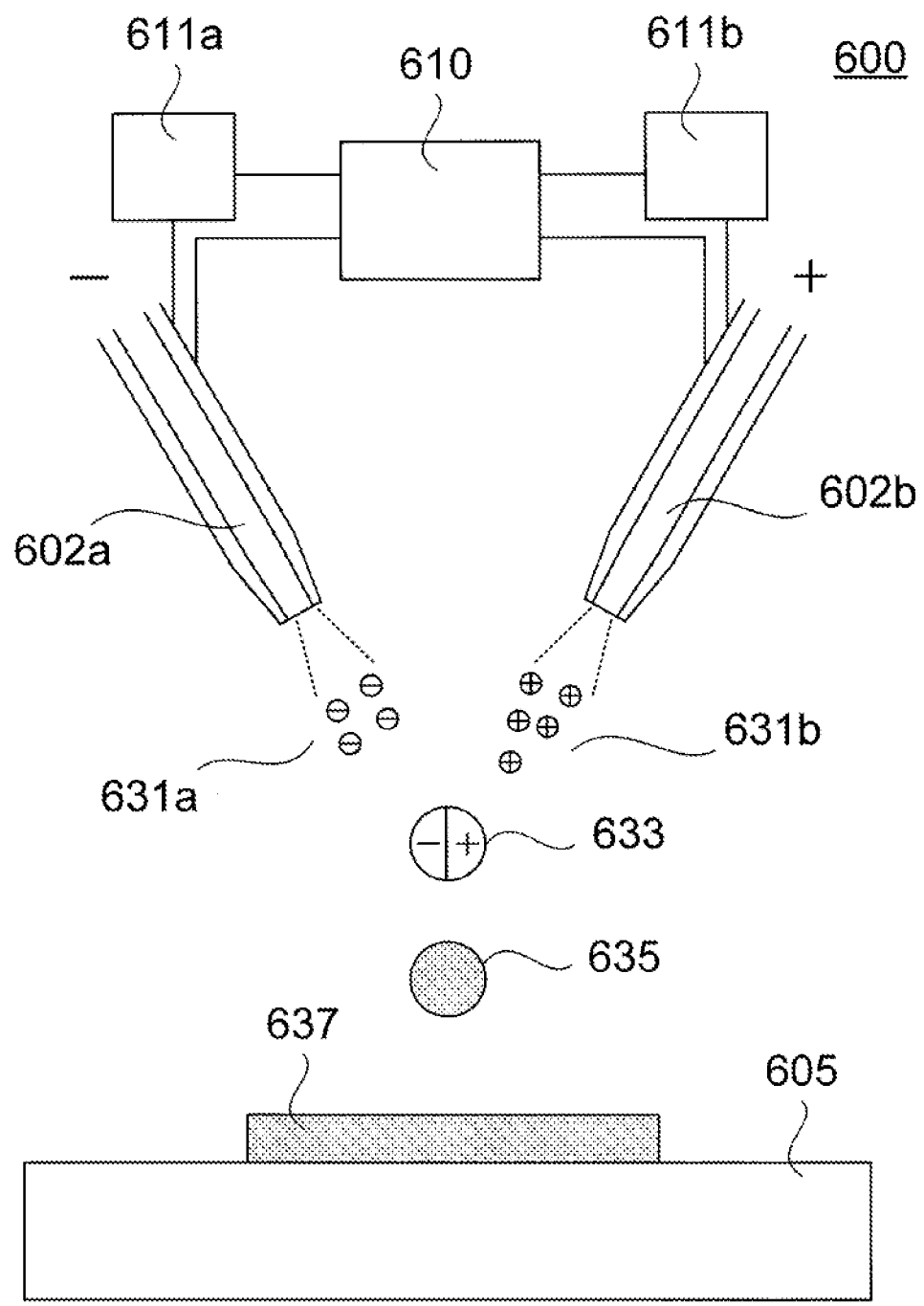
FIG. 10 illustrates a liquid agent synthesizing method according to Embodiment 7 which utilizes electrostatic spraying.

FIG. 10 illustrates the liquid agent synthesizing method according to the embodiment and outlines a liquid agent synthesizing apparatus 600. As shown in FIG. 10, the liquid agent synthesizing apparatus 600 is equipped with a nozzle 602a (first nozzle) and a nozzle 602b (second nozzle). A negative voltage (−) is applied to the nozzle 602a by a controller 610 which includes a voltage control device. A positive voltage (+) is applied to the nozzle 602b by the controller 610 which includes the voltage control device. A substrate 605 (work) is disposed so as to be opposed to the nozzle 602a and the nozzle 602b. The substrate 605 is grounded (connected to GND), and hence voltages whose polarities with respect to the voltage of the substrate 605 are different from each other are applied to the respective nozzles 602a and 602b.

The liquid agent synthesizing apparatus 600 has a driver 611a for moving the nozzle 602a relative to the substrate 605 and a driver 611b for moving the nozzle 602b relative to the substrate 605. Instead, a driver for moving the substrate 605 relative to the nozzles 602a and 602b may be used. In either configuration, the work or the nozzles 602a and 602b can be moved relatively (in the in-plane directions and the height direction).

The nozzle 602a contains a first liquid agent (first material). The first liquid agent is sprayed from the nozzle 602a toward the substrate 605 as particles 631a (fine particles) that are charged negatively (having negative charges) by the above-described electrostatic spraying (or electrostatic coating). On the other hand, a second liquid agent is sprayed from the nozzle 602b toward the substrate 605 as particles 631b (fine particles) that are charged positively (having positive charges) by the same electrostatic spraying (or electrostatic coating).

The particles 631a that are sprayed from the nozzle 602a and the particles 631b that are sprayed from the nozzle 602b have different (opposite) polarities, the former attract the latter and collide or are mixed (combined) with the latter and vice versa when they come into close range. As a result, the particles 631a collide or are mixed with the particles 631b and vice versa in the air (i.e., before they reach the substrate 605) to form particles 633. As a result of such particle collisions, the charge unevenness disappears, whereby synthesis of an extremely small amount of material is enabled, which in turn provides an advantage if a high reaction rate.

Particles 635 stick fast to the surface of the substrate 605 upon arriving the substrate 605. As plural particles 631a and plural particles 631b behave repeatedly in the same manner as described above, a film (thin film 637) is formed on the substrate 605 as a mixture of the two different liquid agents (materials). A controller 610 performs a control so that as described above a synthesized liquid agent is formed on the substrate 605 by combining the negatively charged first liquid agent and the positively charged second liquid agent with each other and a film is formed on the substrate 605 (work) using the synthesized liquid agent.

In the liquid agent synthesizing apparatus 600 according to the embodiment, the nozzles 602a and 602b are inclined from the normal to the surface of the substrate 605 by prescribed angles to properly combine the first liquid agent and the second liquid agent with each other. To this end, the angles of the nozzles 602a and 602b are changed as appropriate according to the kinds of liquid agents and other various conditions. This structure makes it possible to combine particles more effectively.

The liquid agent synthesizing apparatus 600 is equipped with the nozzles 602a and 602b for spraying the first liquid agent and the second liquid agent, respectively. However, the embodiment is not limited to such a case; an additional nozzle(s) may be provided to spray another liquid agent (or other liquid agents). This configuration makes is possible to form a thin film 637 on the substrate 605 by mixing three or more kinds of liquid agents. Furthermore, although FIG. 10 shows only one nozzle 602a and only one nozzle 602b, the embodiment is not limited to such a case; each of the nozzles 602a and 602b may be a multi-nozzle including plural nozzle portions.

Although the liquid agent synthesizing apparatus 600 combines the first liquid agent (particles 631a) and the second liquid agent (particles 631b) with each other in the air (i.e., before they reach the substrate 605), the embodiment is not limited to such a case. For example, a configuration is possible in which particles 631a are combined with particles 631b on the substrate 605 (i.e., after they reach the substrate 605).

In the liquid agent synthesizing apparatus 600 according to the embodiment, it is not always the case that all particles 631a are combined with all particles 631b. It is therefore possible to form a thin film 637 only in a region of particles 635 (combined particles) by performing prescribed treatment after particles 631a and particles 631b (particles 635) reach the substrate 605. For example, by performing solidifying treatment of solidifying particles 635 formed by mixing and then removing remaining particles (particles 631a and 631b) by cleaning treatment, it is possible to leave only a thin film made of the particles 635 on the substrate 605 that is part of a thin film formed on the surface of the substrate 605. In this manner, the liquid agent synthesizing apparatus according to the embodiment can form a thin film having a minute structure whose line width is smaller than or equal to 100 nm, for example, on a substrate.

Embodiments 1 to 7 can provide a resist film forming apparatus and method that employ an electrostatic spraying device or an electrostatic coating device capable of forming a uniform thin film on a work. Embodiments 1 to 7 can also provide a conductive film forming apparatus and method, a PTFE film forming apparatus and method, a phosphor film forming apparatus and method, an insulating film forming apparatus and method, and a liquid agent synthesizing apparatus and method that employ such an electrostatic spraying device or an electrostatic coating device. As described in Embodiment 5, the films are formed to the work in the multiple form by combining them.

Embodiment 8

Figure 11:
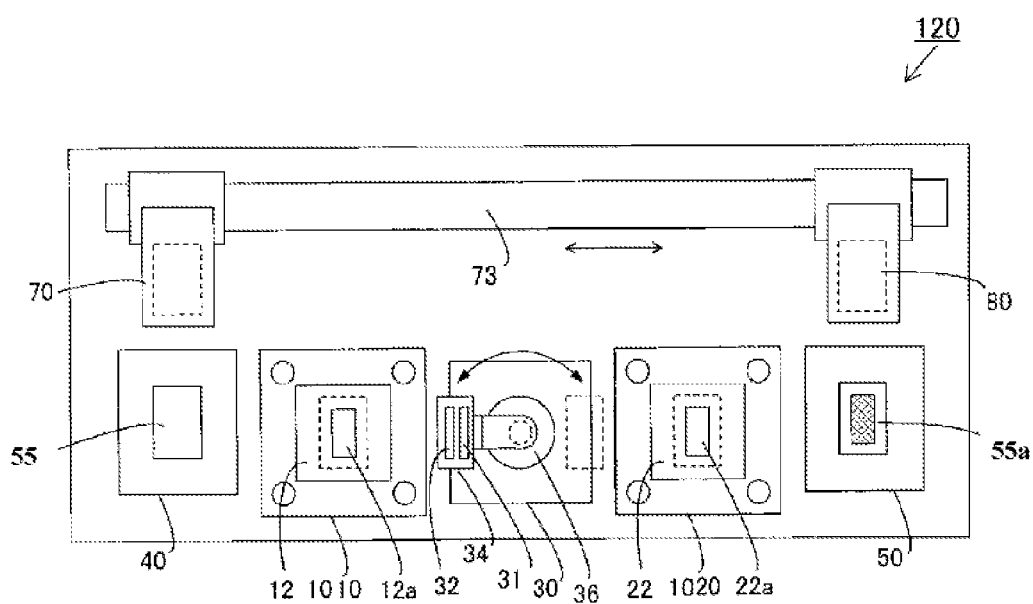
FIG. 11 shows the overall configuration of a resin molding apparatus according to Embodiment 8.

Next, a resin molding apparatus according to Embodiment 8 will be described with reference to FIG. 11. FIG. 11 shows the overall configuration of a resin molding apparatus 120 according to this embodiment. The resin molding apparatus 120 is equipped with two press devices, that is, a first press device 1010 and a second press device 1020. The resin molding apparatus 120 is also equipped with a cleaning device 30 between the first press device 1010 and the second press device 1020. A work loader 40 is disposed on one side of the first press device 1010 and a work unloader 50 is disposed on the other side of the second press device 1020. Although the work loader 40, the first press device 1010, the cleaning device 30, the second press device 1020, and the work unloader 50 are arranged in line in this order, the embodiment is not limited to such a case; they may be arranged in some other way.

The first press device 1010 is equipped with dies including dies 12 (upper die and lower die) as a work 5 to be used for performing resin molding by clamping a molding subject work 55 (in the embodiment, the work 5 will be referred simply as dies 12) and a drive mechanism (not shown) for driving (elevating and lowering) one (upper die or lower die) of the dies 12. Likewise, the second press device 1020 is equipped with dies including dies 22 (upper die and lower die). At least one (upper die and/or lower die) of the dies 12 and at least one (upper die and/or lower die) of the dies 22 are formed with respective cavities 12a and 22a. Although the resin molding apparatus 120 has the two press devices, that is, the first press device 1010 and the second press device 1020, the embodiment is not limited such a case. The concept of the embodiment can also be applied to a resin molding apparatus having only one press device and a resin molding apparatus having three or more press devices.

The work loader 40 houses a molding subject work 55 that is to be supplied to the first press device 1010 or the second press device 1020. The work unloader 50 houses a resin-molded work 55a. A supply-removal mechanism for supplying a molding subject work 55 and removing a molded work 55a are disposed beside the first press device 1010 and the second press device 1020 parallel with them. The supply-removal mechanism is equipped with a loading hand 70 for carrying out a molding subject work 55 from the work loader 40 and supplies it to the first press device 1010 or the second press device 1020 and an unloading hand 80 for carrying out a molded work 55a from the first press device 1010 or the second press device 1020 and causes it to be housed in the work unloader 50. The loading hand 70 and the unloading hand 80 are moved in the direction (left-right direction) indicated by an arrow in FIG. 11 being guided by a guide rail 73.

The cleaning device 30 cleans the dies that are incorporated in the first press device 1010 and the second press device 1020. The cleaning device 30 is equipped with a cleaning head 34 which is equipped with a laser device 31 and an electrostatic spraying device 32 which performs electrostatic spraying of a release agent and a robot hand 36 for moving the cleaning head 34 by swinging or elongation/contraction. The robot hand 36 swings the cleaning head 34 alternately to respective positions opposed to the first press device 1010 and the second press device 1020 and extends or contracts its arm there to cause the cleaning head 34 to enter the first press device 1010 or the second press device 1020 and perform cleaning there.

In the embodiment, the laser device 31 and the electrostatic spraying device 32 may be disposed on different cleaning heads. The cleaning device 30 may be divided into a first cleaning device having the laser device 31 and a second cleaning device having the electrostatic spraying device 32. In this case, dies that have been moved onto a table of the second cleaning device can be subjected to cleaning by electrostatic spraying.

The laser device 31 operates to irradiate (the surfaces of) the dies that have been used for resin molding with laser light (energy beam) and to thereby cause resin refuse that is stuck to and remaining on the die surfaces and residues of resin components remaining on the die surfaces to peel off the die surfaces or let them easily peel off the dis surfaces. That is, by irradiating the die surfaces with laser light, the laser device 31 serves to lower the adhesion between die-staining layers or die stain and the die surfaces by distorting the die-staining layers that are stuck to the die surfaces or burning (or decomposing or destroying) portions where the die stain (die-staining layers) adheres to the die surfaces.

Where a release agent is already placed on the surfaces of the dies 12 or 22, the laser device 31 also causes the release agent to peel off. Therefore, a new release agent can be placed on the surfaces of the dies 12 by performing cleaning using the electrostatic spraying device 32 after performing cleaning using the laser device 31. In this case, an old release agent and die stain are peeled off the surfaces of the dies 12 because they have been subjected to the cleaning by the laser device 31. As a result, a high-quality thin film (release agent) can be formed on the dies 12.

The laser device 31 is an ultraviolet semiconductor laser diode, a blue laser diode, a red laser diode, an infrared laser diode, a YAG laser, a $CO_2$ laser, or the like. Instead of a semiconductor laser, a light-emitting diode such as an ultraviolet light-emitting diode or an infrared light-emitting diode may be used. Laser light may be formed by deflecting a single light beam optically by a galvano mirror or increasing the width of a light beam by a cylindrical lens.

Next, the electrostatic spraying device 32 employed in the embodiment will be described with reference to FIG. 1. FIG. 1 shows a general configuration of the electrostatic spraying device 32 employed in the embodiment. The electrostatic spraying device 32 forms a release agent film (thin film) on the die 12 or 22 as the work 5 by electrostatic spraying.

The electrostatic spraying device 32 is mainly composed of a nozzle 2, a controller 10 having a voltage control device (not shown), and a table 7. Cleaning of the die 12 or 22 by the electrostatic spraying device 32 is performed after cleaning by the above-described laser device 31. The electrostatic spraying device 32 may clean the die 12 or 22 either in a state that the die 12 or 22 is placed in the corresponding press device or in a state that the die 12 or 22 has been moved onto a dedicated table 7 provided in the electrostatic spraying device 32.

A liquid agent as a release agent is supplied to the nozzle 2 from the direction indicated by arrow A in FIG. 1. The controller 10 applies a prescribed voltage between an electrode 2a of the nozzle 2 and an electrode 7a of the table 7. The die 12 (or die 22) is placed on the table 7 so as to be opposed to a tip portion 2b of the nozzle 2 (nozzle tip portion). The diameter (i.e., the inner diameter for passage of a liquid agent) of the nozzle tip portion is set at about 5 to 400 µm, for example.

When the prescribed voltage is applied by the controller 10, a release agent (liquid agent) is sprayed from the tip portion 2b of the nozzle 2 toward the die. Repulsion occurs in the release agent that is located inside the nozzle 2 due to the electrostatic force produced by the application voltage, and the release agent becomes fine particles against the surface tension of the liquid surface in the tip portion 2b of the nozzle 2. Charged positively or negatively, the fine particles of the release agent repel each other and hence can be sprayed without cohering together. All of the sprayed particles or the vaporized release agent is stuck to the die surface by electrostatic force. In this manner, immediately after being sprays from the tip portion 2b of the nozzle 2, the release agent is in the form of particles 31a having relatively large diameters. Then the release agent is transformed into particles 31b having relatively small diameters, which are deposited on the die 12 (22). A thin film of the release agent is formed on the die surface by solidifying the deposited particles 31b (release agent). Although the release agent is typically made of a fluorine-based material or a silicone-based material, the embodiment is not limited to such a case.

In the embodiment, the thickness of a film (a thin film of the release agent) formed on the die 12 or 22 is about 1 to 5 µm, for example. Even preferably, the thickness of a thin film is 1 to 3 µm. This is because two thick a release agent film necessitates dummy shots before work resin molding as in the background-art techniques and too thin a release agent film renders the release agent less effective. As described above, this electrostatic spraying technique makes it possible to form a thin film that cannot be formed by any background-art spraying techniques. Furthermore, the electrostatic spraying can form a uniform release agent film even in a recess (level difference portion) like the die cavities 12a and 22a.

As described above, the embodiment makes it possible to form a thin film of a release agent on the die surface by electrostatic spraying. Where the thickness of a release agent placed on the die surface is as small as about 1 to 5 µm, the transfer of the release agent to a product (resin) at the time of actual work resin molding. Therefore, unlike in background-art cases, it is not necessary to make dummy shots before work resin molding to suppress transfer of a release agent to a resin. This makes it possible to facilitate the cleaning process.

Next, how to generate a voltage to be applied in the electrostatic spraying device 32 (to generate static electric-ity) will be described with reference to FIG. 2. FIG. 2 illustrates a DC voltage that is applied in the electrostatic spraying device 32. FIG. 2 shows a state that the work 5 as the die 12 (table 7) is grounded (connected to GND) and a positive (+) DC voltage is applied to the nozzle 2. However, the embodiment is not limited to this case; a negative (−) DC voltage may be applied to the nozzle 2. Whether to use a positive voltage or a negative voltage is set as appropriate according to the materials of the release agent and the work 5 (die 12) and other factors. Since it suffices to apply a voltage of a fixed polarity, the voltage is not limited to a DC voltage, a control may be made so that the magnitude of the voltage is varied during spraying while its polarity is maintained. Furthermore, a pulse voltage may be applied whose magnitude varies between a high level and a low level of a fixed polarity (positive or negative). Where such a pulse voltage is applied, it may either include or not include 0 V. In the embodiment, the distance d between the tip portion 2b of the nozzle 2 and the surface of the die 12 is set at about 0.5 to 20 mm, for example.

In the embodiment, a configuration is possible in which a pulse voltage is applied instead of a DC voltage. In this case, the controller 10 of the electrostatic spraying device 32 applies, to the nozzle 2, a pulse voltage whose polarity with respect to the die 12 (table 7) becomes positive or negative alternately (pulse oscillation is caused). A pulse voltage is used suitably for a case that the conductivity of the die 12 is low.

Where a pulse voltage is applied, first, a positive voltage (+ voltage) is applied to the nozzle 2 as shown in FIG. 3A. At this time, positive charges (+ charges) are accumulated in the surface (nozzle-2-side surface) of the work 5 (die 12) and this surface is charged positively. Then, as shown in FIG. 3B, a negative voltage (− voltage) is applied to the nozzle 2. At this time, particles 31b sprayed electrostatically from the nozzle 2 are charged negatively and hence stick to (hit) the surface of the work 5 (die 12) being charged positively. Then, as shown in FIG. 3C, a positive voltage (+ voltage) is applied to the nozzle 2. At this time, particles 31b sprayed electrostatically from the nozzle 2 are charged positively and hence stick to the surface of the die 12.

Particles 31b to constitute a thin film of the release agent are deposited on the die 12 by repeatedly establishing the state that the negative voltage is applied (see FIG. 3B) and the state that the positive voltage is applied (see FIG. 3C) (i.e., by applying the pulse voltage). The magnitude of the pulse voltage is set at about 0.5 to 10 kV, for example, and the pulse width (spraying speed) is set so as to correspond to about 5 Hz to 1 kHz, for example. The distance d between the tip portion 2b of the nozzle 2 and the surface of the die 12 is set at about 0.5 to 20 mm, for example.

In the embodiment, the spraying distance, that is, the position (height) of the nozzle 2, may be controlled to control the particle diameters of particles 31b that reach the die 12. FIG. 4 shows how a position control (height control) is performed on the nozzle 2 (nozzle tip portion) in the electrostatic spraying device 32. As shown in FIG. 4, the electrostatic spraying device 32 is equipped with a camera 8 which is disposed so as to be able to observe particles 31b that have reached the surface of the die 12. Particle diameters or a coating state of particles 31b is thus observed using the camera 8, and a control is performed so as to move the nozzle 2 to a desired position according to an observation result. For example, as shown in FIG. 4, it is possible to change the distance between the nozzle tip portion and the surface of the die 12 from d1 to d2 during spraying.

Such a control can be performed automatically through image processing or manually. The method for controlling particle diameters is not limited to changing the height or the position in the left-right direction of the nozzle 2; for example, a configuration may be employed in which the nozzle diameter, the magnitude or pulse width of an application voltage is changed. This control is effective in the case where the electrostatic characteristic of the die 12 varies while a thin film of a release agent is being formed on the die 12.

In the embodiment, a configuration is possible in which the nozzle 2 is equipped with plural nozzle portions. In this case, to place a release agent uniformly on the die 12, voltages (pulse voltages) that are applied to the plural respective nozzle portions may be controlled independently of each other. The arrangement of the plural nozzle portions may be varied from one prescribed region to another. Setting magnitudes of voltages makes it possible to form a thin film of a release agent with a more uniform thickness distribution.

Figure 12:
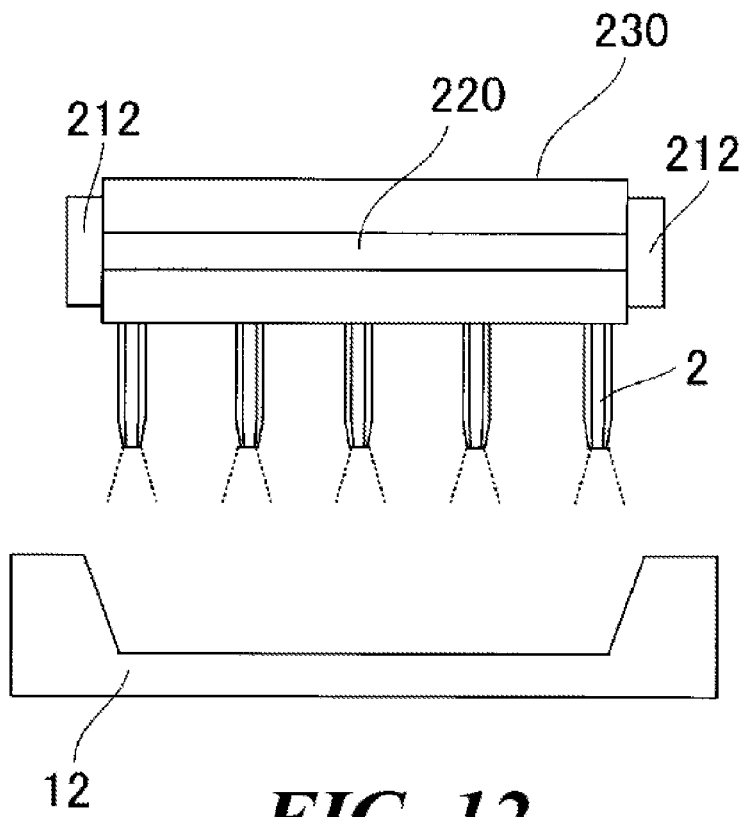
FIG. 12 shows a general configuration of a cooling device according to Embodiment 8.

Next, a cooling device 230 employed in the embodiment will be described with reference to FIG. 12. FIG. 12 shows a general configuration of the cooling device 230. The cooling device 230 is provided in the electrostatic spraying device 32, and is configured so as to cool a release agent. The electrostatic spraying device 32 sprays a release agent as cooled by the cooling device 230 from a nozzle 2 toward the die 12. Usually, the die 12 is set in a high temperature state of 180° C., for example. If it is attempted to spray a release agent in such a high temperature state, the release agent (liquid agent) that is located inside the nozzle 2 before spraying may vaporize. To avoid this phenomenon reliably, the cooling device 230 is provided in the electrostatic spraying device 32 and the liquid agent in the nozzle 2 is cooled. The cooled liquid agent is sprayed toward the die 12.

The cooling device 230 is equipped with a Peltier device 212, for example, and a passage 220 of air that is cooled by the Peltier device is provided inside the cooling device 230 (air cooling structure). Instead of air, water (cooling water) may circulate through the passage 220. Thus, the cooling device 230 cools the liquid agent (release agent) introduced into the nozzle 2 through circulation of cooled air or water. The above-described controller 10 causes the cooled liquid agent to be sprayed from plural nozzles 2a (multi-nozzle) toward the die 12. Cooling the release agent by the cooling device 230 makes it possible to suppress the vaporization of the liquid agent and thereby allow the electrostatic spraying device 32 to perform cleaning more effectively.

After cleaning has been performed on the dies 12 (or dies 22) using the laser device 31 and the electrostatic spraying device 32, a new molding subject work 55 is supplied to the first press device 1010 (or second press device 1020) by the loading hand 70 with the dies 12 (or dies 22) opened and resin molding is performed in a state that the molding subject work 55 is clamped by the dies 12 (or dies 22). As a result, a resin-molded work 55a is obtained.

The cleaning by the electrostatic spraying device 32 according to the embodiment may be performed every time resin molding is performed on a work 5. Alternatively, the cleaning by the electrostatic spraying device 32 may be performed once when resin molding has been performed a prescribed number of times.

As described above, the resin molding apparatus 120 according to the embodiment has the laser device 31 for irradiating the dies 12 with laser light, the electrostatic spraying device 32 for forming a thin film of a release agent on the dies 12 by applying a prescribed voltage between the nozzle 2 and the dies 12 after the irradiation with laser light and thereby spraying the release agent electrostatically from the nozzle 2 toward the dies 12, and the press device (first press device 1010 (or second press device 1020)) for performing resin molding on a work 55 to be molded using the dies 12 on which the thin film of the release agent is formed.

The configuration according to the embodiment makes it possible to form a uniform thin film of a release agent on a die by electrostatic spraying of the release agent. Thus, unlike in background-art cases in which a non-uniform, relatively thick film of a die-fitting agent is formed, contamination of a work molding resin with a thin film of a release agent is suppressed without the need for making dummy shots before resin molding on a work. Therefore, the invention can provide a resin molding apparatus and method in which a cleaning process is facilitated.

Among Embodiments 1 to 8, this embodiment, for example, has been described as having the configuration in which electrostatic spraying is performed after cleaning by the laser device. However, the resin molding apparatus and method according to the embodiment does not necessarily assume the use of a laser device. The resin molding apparatus and method according to the embodiment may employ another cleaning method such as plasma cleaning or ashing cleaning.

Embodiment 9

Next, electrostatic spraying according to Embodiment 9 of the invention will be outlined with reference to FIG. 1. FIG. 1 shows a general configuration of an electrostatic spraying device 32 employed in this embodiment. The electrostatic spraying device 32 forms a thin film on a wire by electrostatic spraying. Although the wire is typically a fiber wire, an insulative plastic wire, or a metal wire made of gold, silver, or tungsten, the embodiment is not limited to such a case. The term "wire" as used herein includes a wire that is flexible in the longitudinal direction and a wire (continuous body) also called a thread or a line. Examples of the thin film are a conductive film (metal film such as a Cu film), a dielectric film, an insulating film (made of a polyimide resin, epoxy resin, or silicone resin), an enamel film, an organic EL film, a solar cell film, a plastic film, and a ceramic film (the embodiment is not limited to these examples).

The electrostatic spraying device 32 is mainly composed of a nozzle 2, a controller 10, and an electrode portion (i.e., an electrode that is the same as or similar to the electrode 7a of the table 7) for applying a prescribed potential directly to a wire 305 as a work 5 (the table 7 is not provided). The controller 10 includes a voltage control device for applying a prescribed voltage to the nozzle 2. A liquid agent is supplied to the nozzle 2 from the direction indicated by arrow A in FIG. 1. A proper liquid agent is selected according to the type of a thin film to be formed on the wire 305 as the work 5 (in the embodiment, the work 5 will be hereinafter referred to simply as the wire 305). For example, to form a conductive film on the wire 305, a liquid agent in which a metal such as Ni, Cu, or Ag is dissolved in a prescribed solvent is used as a liquid agent as ingredients of the conductive film.

The controller 10 applies a prescribed voltage between an electrode 2a of the nozzle 2 and the electrode portion. The wire 305 is held so as to be opposed to a tip portion 2b of the nozzle 2 (nozzle tip portion). The diameter (i.e., the inner diameter for passage of a liquid agent) of the nozzle tip portion is set at about 5 to 400 μm, for example.

When the prescribed voltage is applied between the nozzle 2 and the wire 305 by the controller 10, a liquid agent is sprayed from the tip portion 2b of the nozzle 2 toward the wire 305. Repulsion occurs in the liquid agent that is located inside the nozzle 2 due to the electrostatic force produced by the application voltage, and the liquid agent becomes fine particles against the surface tension of the liquid surface in the tip portion 2b of the nozzle 2. Charged positively or negatively, the fine particles of the liquid agent repel each other and hence can be sprayed without cohering together. All of the sprayed particles or the vaporized release agent is stuck to the wire 305 as the work by electrostatic force. In this manner, immediately after being sprayed from the tip portion 2b of the nozzle 2, the liquid agent is in the form of particles 31a having relatively large diameters. Then the liquid agent is transformed into particles 31b having relatively small diameters, which are deposited on the wire 305. A thin film of the liquid agent is formed on the surface of the wire 305 by solidifying the deposited particles 31b (liquid agent).

In the embodiments, the thickness of a film (thin film) formed on the wire 305 is about 1 to 5 μm, for example, and a uniform thin film can be formed. The thickness of a film to be formed on the wire 305 can be set as appropriate according to its ingredients (i.e., thin film type). As described above, the electrostatic spraying technique according to the embodiments makes it possible to form, uniformly, on the wire 305, a thin film that cannot be formed by any background-art spraying techniques.

Next, how to generate a voltage to be applied in the electrostatic spraying device 32 (to generate static electricity) will be described with reference to FIGS. 2 and 3A to 3C. Although in FIGS. 1-4 the work 5 is terminated at both ends so as to be a short object, they are just conceptual diagrams. FIG. 2 illustrates a DC voltage that is applied in the electrostatic spraying device 32. FIGS. 3A to 3C illustrate a pulse voltage that is applied in the electrostatic spraying device 32.

FIG. 2 shows a state that the wire 305 (electrode portion) is grounded (connected to GND) and a positive (+) DC voltage is applied to the nozzle 2. However, the embodiment is not limited to this case; a negative (−) DC voltage may be applied to the nozzle 2. Whether to use a positive voltage or a negative voltage is set as appropriate according to the material types of the liquid agent and the wire 305 and other factors. Since it suffices to apply a voltage of a fixed polarity, the voltage is not limited to a DC voltage; a control may be made so that the magnitude of the voltage is varied during spraying while its polarity is maintained. Furthermore, a pulse voltage may be applied whose magnitude varies between a high level and a low level of a fixed polarity (positive or negative). Where such a pulse voltage is applied, it may either include or not include 0 V. In the embodiment, the distance d between the tip portion 2b of the nozzle 2 and the surface of the wire 305 is set at about 0.5 to 20 mm, for example.

In the embodiment, a configuration is possible in which a pulse voltage is applied instead of a DC voltage. In this case, the controller 10 of the electrostatic spraying device 32 applies, to the nozzle 2, a pulse voltage whose polarity with respect to the wire 305 (electrode portion) becomes positive or negative alternately (pulse oscillation is caused). A pulse voltage is used in, for example, a case that the conductivity of the wire 305 is low. A pulse voltage is used suitably for a case of forming a thin film selectively on the surface of the wire 305. This is because the spraying of a liquid agent from the nozzle 2 can be controlled according to the polarity of a pulse voltage.

Where a pulse voltage is applied, first, a positive voltage (+ voltage) is applied to the nozzle 2 as shown in FIG. 3A. At this time, positive charges (+ charges) are accumulated in the surface (nozzle-2-side surface) of the wire 305 and this surface is charged positively. Then, as shown in FIG. 3B, a negative voltage (− voltage) is applied to the nozzle 2. At this time, particles 31b sprayed electrostatically from the nozzle 2 are charged negatively and hence stick to (hit) the surface of the wire 305 being charged positively. Then, as shown in FIG. 3C, a positive voltage (+ voltage) is applied to the nozzle 2. At this time, particles 31b sprayed electrostatically from the nozzle 2 are charged positively and hence stick to the surface of the wire 305.

Particles 31b to constitute a thin film of the liquid agent are deposited on the wire 305 by repeatedly establishing the state that the negative voltage is applied (see FIG. 3B) and the state that the positive voltage is applied (see FIG. 3C) (i.e., by applying the pulse voltage). The magnitude of the pulse voltage is set at about 0.5 to 10 kV, for example, and the pulse width (spraying speed) is set so as to correspond to about 5 Hz to 1 kHz, for example. The distance d between the tip portion 2b of the nozzle 2 and the wire surface is set at about 0.5 to 20 mm, for example.

In the embodiment, the spraying distance, that is, the position (height) of the nozzle 2, may be controlled to control the particle diameters of particles 31b that reach the wire 305. FIG. 4 shows how a position control (height control) is performed on the nozzle 2 (nozzle tip portion) in the electrostatic spraying device 32. As shown in FIG. 4, the electrostatic spraying device 32 is equipped with a camera 8 which is disposed so as to be able to observe particles 31b that have reached the surface of the wire 305. Particle diameters or a coating state of particles 31b is thus observed using the camera 8, and a control is performed so as to move the nozzle 2 to a desired position according to an observation result. For example, as shown in FIG. 4, it is possible to change the distance between the nozzle tip portion and the surface of the wire 305 from d1 to d2 during spraying.

Such a control can be performed automatically through image processing or manually. The method for controlling particle diameters is not limited to changing the height or the position in the left-right direction of the nozzle 2; for example, a configuration may be employed in which the nozzle diameter, the magnitude or pulse width of an application voltage is changed. This control is effective in the case where the electrostatic characteristic of the wire 305 varies while a thin film of a liquid agent is being formed on the wire 305.

In the embodiment, to form a uniform thin film on the surface of the wire 305, it is preferable for the electrostatic spraying device 32 that plural nozzles 2 (plural nozzle portions) be provided around the wire 305. To form an even uniform thin film, a configuration is preferable in which the plural nozzles 2 performs spraying toward the wire 305 from its radial directions.

Figure 13:
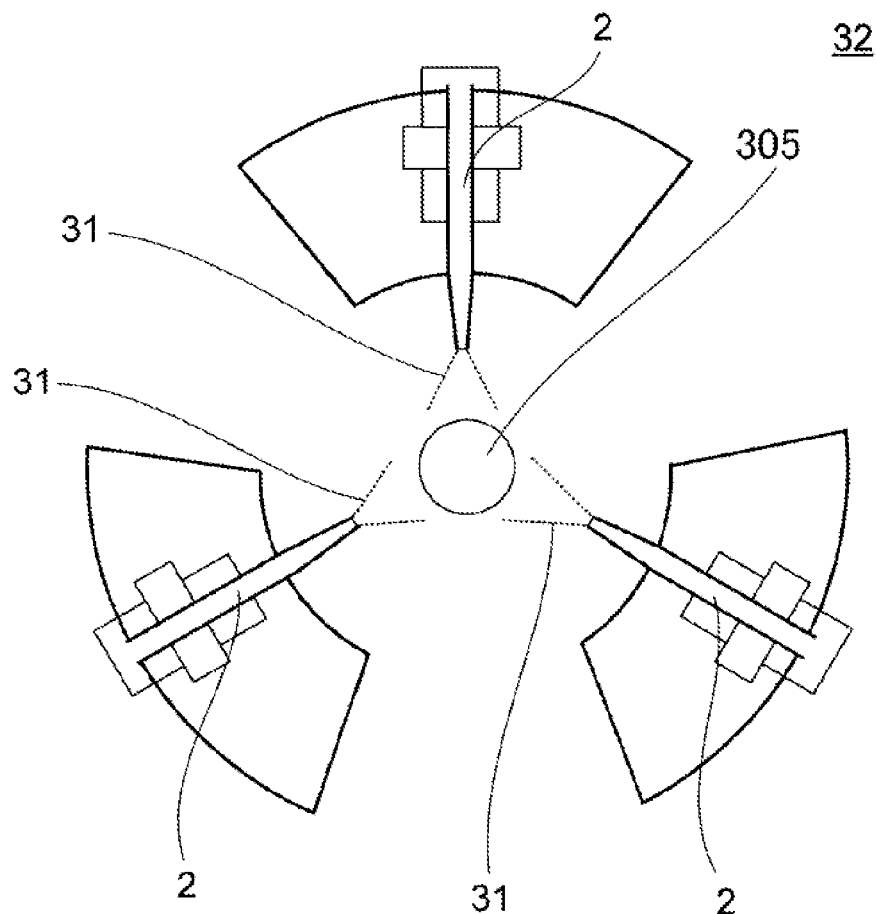
FIG. 13 shows an arrangement of nozzles of an electrostatic spraying device (electrostatic coating device) employed in Embodiment 9.

Next, an electrostatic spraying device 32 having plural nozzles will be described with reference to FIG. 13. FIG. 13 shows an arrangement of the plural nozzles in the electrostatic spraying device 32, and is a cross section taken perpendicularly to the extending direction of a wire 305 (i.e., the wire 305 extends perpendicularly to the paper surface).

As shown in FIG. 13, three nozzles 2 are arranged around the wire 305. The three nozzles 2 are arranged so as to form the same angles (120°) in a plane that is perpendicular to the wire 305. Arranging the three nozzles 2 so as to form the same angles in this manner makes it possible to form a uniform thin film on the wire 305. In the embodiment, the number of nozzles 2 is not limited to three; two or four or more nozzles 2 may be arranged around the wire 305. The embodiment is not limited to the case that the plural nozzles 2 are arranged so as to form the same angles; the plural nozzles 2 may be arranged so as to have an arbitrary angular relationship as long as a film having a uniform thickness distribution can be formed on the wire 305. In the embodiment, to form a uniform-thickness film more easily, it is preferable to use plural nozzles 2. However, since a thin film can be formed even with a single nozzle 2, it is not always necessary to arrange plural nozzles 2. In this case, spraying may be performed with the nozzle 2 either fixed or rotated in the circumferential direction in such a manner as to be directed toward the wire 305.

To form a uniform-thickness film on the wire 305, it is preferable that the same voltage (DC voltage or pulse voltage) be applied to the plural nozzles 2. However, if necessary, the voltages that are applied to the plural respective nozzles 2 may be controlled independently of each other.

Figure 14:
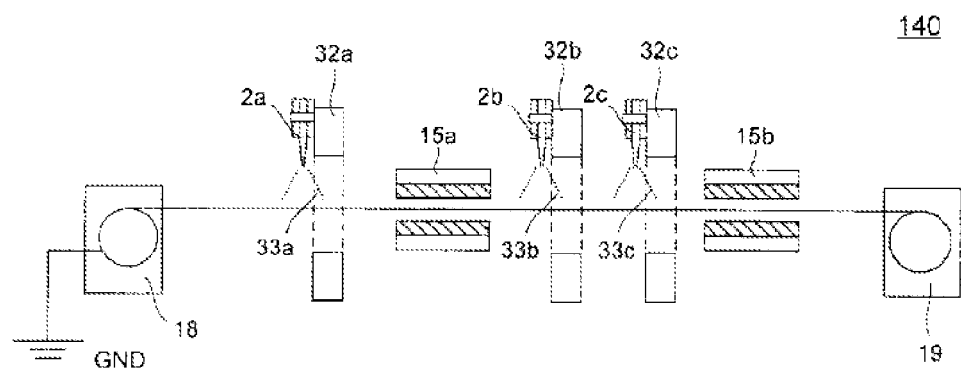
FIG. 14 shows a general configuration of a thin-film forming apparatus according to Embodiment 9.

Next, a thin-film forming apparatus according to the embodiment will be described with reference to FIG. 14. FIG. 14 shows a general configuration of a thin-film forming apparatus 140. The thin-film forming apparatus 140 is configured so as to form a thin film(s) on a wire 305 by electrostatic spraying. In the embodiment, the thin-film forming apparatus 140 is equipped with three electrostatic spraying devices 32a, 32b, and 32c (plural electrostatic spraying devices). However, the configuration of the thin-film forming apparatus 140 according to the invention is not limited to the one having the three electrostatic spraying devices 32a, 32b, and 32c; a configuration having only one electrostatic spraying device or a configuration having two or four or more electrostatic spraying devices are possible.

The electrostatic spraying device 32a (first electrostatic spraying device) has first plural nozzles 2a for spraying a first liquid agent 33a as ingredients of a first thin film toward the wire 305 from its plural radial directions and a first voltage control device (not shown) for applying a first voltage between each of the first plural nozzles 2a and the wire 305. The first plural nozzles 2a are arranged so as to form the same first angles (120° in the case where three nozzles 2a are provided) in a plane that is perpendicular to the wire 305 (wire moving direction).

The electrostatic spraying device 32b (second electrostatic spraying device) has second plural nozzles 2b for spraying a second liquid agent 33b as ingredients of a second thin film toward the wire 305 from its plural radial directions and a second voltage control device (not shown) for applying a second voltage between each of the second plural nozzles 2b and the wire 305. The second plural nozzles 2b are arranged so as to form the same second angles (120° in the case where three nozzles 2b are provided) in a plane that is perpendicular to the wire 305.

Likewise, the electrostatic spraying device 32c (third electrostatic spraying device) has third plural nozzles 2c for spraying a third liquid agent 33c as ingredients of a third thin film toward the wire 305 from its plural radial directions and a third voltage control device (not shown) for applying a third voltage between each of the third plural nozzles 2c and the wire 305. The third plural nozzles 2c are arranged so as to form the same third angles (120° in the case where three nozzles 2c are provided) in a plane that is perpendicular to the wire 305.

In the embodiment, the thin-film forming apparatus 140 is equipped with moving devices 18 and 19 for moving the wire 305 (i.e., a thin-film forming region of the wire 305). The moving device 18 is a pay-out device for paying out the wire 305 and the moving device 19 is a take-up device for taking up the wire 305. However, the embodiment is not limited this structure; the wire 305 may be moved by some other method A thin film can be formed with a uniform thickness distribution if the wire 305 is moved at a constant speed during the film formation in the moving devices 18 and 19. However, the embodiment is not limited to the case of moving the wire 305 at a constant speed. For example, the film thickness can be varied by varying the movement speed of the wire 305. For another example, to form a thin film in particular minute regions (i.e., to form a minute structure), a control may be made so as to suspend a movement of the wire 305 and restart its movement after formation of a thin film. Although the moving device 18 is provided with an electrode portion for grounding the wire 305 (giving it the GND potential), such an electrode portion may be provided in a device or the like other than the moving device 18. A potential other than the GND potential may be applied to the electrode portion.

In the embodiment, the thin-film forming apparatus 140 is also equipped with a first drying/firing device 15a and a second drying/firing device 15b for drying and firing the wire 305 on which a thin film has been formed. The first dying/firing device 15a is disposed between the first electrostatic spraying device 32a and the second electrostatic spraying device 32b. The second drying/firing device 15b is disposed between the third electrostatic spraying device 32c and the moving device 19.

In the embodiment, first, the first voltage control device of the first electrostatic spraying device 32a applies the first voltage and thereby causes the first liquid agent 33a to be sprayed from the first plural nozzles 2a toward the wire 305, whereby a first thin film is formed on the wire 305. The wire 305 on which the first thin film is formed is then moved to the first drying/firing device 15a, which dries and fires the wire 305 on which the first thin film is formed.

Subsequently, the second voltage control device of the second electrostatic spraying device 32b applies the second voltage and thereby causes the second liquid agent 33b to be sprayed from the second plural nozzles 2b toward the wire 305, whereby a second thin film is formed on the wire 305 on which the first thin film is already formed. Furthermore, the third voltage control device of the third electrostatic spraying device 32c applies the third voltage and thereby causes the third liquid agent 33c to be sprayed from the third plural nozzles 2c toward the wire 305, whereby a third thin film is formed on the wire 305 on which the second thin film is already formed. The embodiment assumes a case that the second thin film which is formed by the second electrostatic spraying device 32b is a thin film that can be dried easily, and hence no drying/firing device is disposed between the second electrostatic spraying device 32b and the third electrostatic spraying device 32c. However, if necessary, a drying/firing device may be disposed between the second electrostatic spraying device 32b and the third electrostatic spraying device 32c.

Subsequently, the wire 305 on which the third thin film is already formed is moved second drying/firing device 15b, and the second drying/firing device 15b dries and fires the wire 305 on which the third thin film is formed. If the first thin film or the second thin film is a thin film that can be dried easily, the first drying/firing device 15a or the second drying/firing device 15b shown in FIG. 14 may be omitted.

When all the steps have been executed and the first, second, and third thin films have been formed on the wire 305, the wire 305 is taken up by the moving device 19.

The embodiment can provide a thin-film forming apparatus 140 capable of forming a uniform thin film(s) on a wire. Furthermore, since the thin-film forming apparatus is equipped with the plural electrostatic spraying devices, a uniform lamination structure can be formed on a continuous wire by forming plural kinds of thin films having uniform thickness distributions on the wire.

For example, three layers of the above-mentioned respective liquid agents may be laid one on another on an insulative, poly(ethylene terephthalate) (PET) wire 305 using the three electrostatic spraying devices 32a, 32b, and 32c. For example, a wire that functions as an organic EL device can be manufactured by forming, on a wire 305, in order, three films (layers), that is, an aluminum electrode film to be connected to a cathode, a light-emitting film of an organic EL material, and a transparent indium tin oxide (ITO) electrode film to be connected to an anode. With the above-described configuration, since each film can be formed so as to have a uniform thickness distribution by electrostatic spraying, a wire-shaped organic EL device capable of uniform light emission in the wire radial and longitudinal directions. Au antireflection film, a color filter, or a protective film may be formed on the outside electrode film.

A conductive wire which has a protective film and is protected from wire short-circuiting can be manufactured by forming an insulating film made of, for example, a polyimide resin or an epoxy resin on a conductive wire made of gold, copper, or the like using the single electrostatic spraying device 32a.

Embodiment 10

Figure 15:
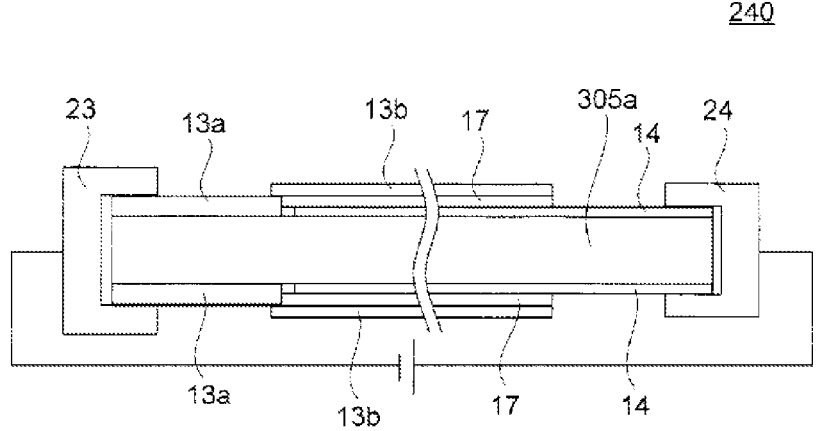
FIG. 15 shows a general configuration of an organic EL device according to Embodiment 10.

Next, Embodiment 10 of the invention will be described with reference to FIG. 15. FIG. 15 shows a general configuration of an organic EL device 240 (OLED) according to this embodiment. The organic EL device 240 is a wire-shaped organic EL device and individual films on a wire are formed by the electrostatic spraying according to Embodiment 9. The method illustrated by FIGS. 1-4 (conceptual diagrams) are also applied to this embodiment. The work 5 is a wire.

More specifically, symbol 305a in FIG. 15 denotes an insulative wire. A first electrode 14 (conductive film) is formed on the insulative wire 305a in a first region by electrostatic spraying. The first electrode 14 is electrically connected to a cathode 24 of the organic EL device 240. A light-emitting layer 17 (organic EL film) is formed on the first electrode 14 of the insulative wire 305a.

Furthermore, a second electrode 13a (conductive film) is formed on the insulative wire 305a in a second region. A second electrode 13b (conductive film) is formed on the light-emitting layer 17 of the insulative wire 305a. In the embodiment, the second electrode 13b is a transparent electrode made of indium tin oxide (ITO), for example. The second electrodes 13a and 13b are electrically connected to an anode 23 of the organic EL device 240. In the embodiment, in the second region of the insulative wire 305a, a second electrode 13a may be formed on an insulating film that has been formed first. A flexible light-emitting device can be manufactured by constructing a light-emitting member using a wire-shaped organic EL device as described above.

Although the wire-shaped organic EL device has been described above, the embodiment is not limited to it. For example, a wire-shaped solar cell can be formed using an apparatus for forming plural kinds of thin films on a wire by electrostatic spraying. For example, a wire-shaped solar cell device can be manufactured by forming a silicon, compound, or organic light-emitting layer in place of the above-described light-emitting layer 17 (organic EL film). The power generation efficiency can be increased by forming an antireflection film on the outside electrode film. A flexible light-emitting device can be manufactured by constructing a power generation member using such a wire-shaped solar cell device.

Although a wire-shaped organic EL device or a wire-shaped solar cell device is formed by the electrostatic spraying method (the thin-film forming apparatus according to Embodiment 9), the invention is not limited to such a case. For example, a wire-shaped organic EL device can be manufactured by forming individual films described above by repeatedly performing such a film forming method as an air-type spraying method in which a liquid agent film is formed on a wire by spraying it by jetting of air or dip coating in which a liquid agent film is formed by dipping a wire into a liquid agent and drying the pulled-up wire. A wire-shaped organic EL device can also be manufactured by extruding a lamination material of layers described above to produce a thin wire.

Embodiment 11

Figure 16:
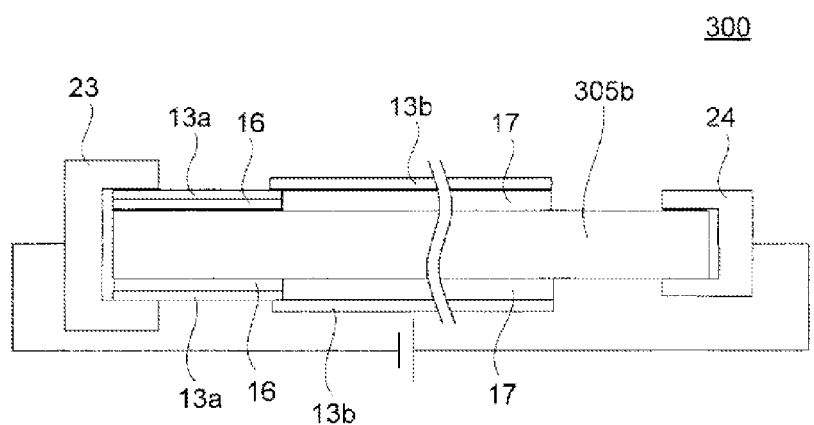
FIG. 16 shows a general configuration of an organic EL device according to Embodiment 11.

Next, Embodiment 11 of the invention will be described with reference to FIG. 16. FIG. 16 shows a general configuration of an organic EL device 300 (OLED) according to this embodiment. As in Embodiment 10, the organic EL device 300 is a wire-shaped organic EL device and individual films on a wire are formed by the electrostatic spraying according to Embodiment 9. This embodiment is different in configuration from Embodiment 10 in that the former uses a conductive wire 305b whereas the latter uses the insulative wire 305a. The method illustrated by FIGS. 1-4 (conceptual diagrams) are also applied to this embodiment.

In FIG. 16, symbol 305b denotes a conductive wire. The conductive wire 305b serves as a first electrode and is electrically connected to a cathode 24. Au insulating layer 16 (insulating film) is formed on the conductive wire 305b in a first region by electrostatic spraying. A light-emitting layer 17 (organic EL film) is formed on the conductive wire 305b in a second region.

Furthermore, a second electrode 13a is formed on the insulating layer 16. A second electrode 13b is formed on the light-emitting layer 17. In the embodiment, the second electrode 13b is a transparent electrode (ITO). The second electrodes 13a and 13b are electrically connected to an anode 23 of the organic EL device 300. As in Embodiment 10, this configuration makes it possible to manufacture a wire-shaped organic EL device capable of uniform light emission.

Although the wire-shaped organic EL device has been described above, like Embodiment 10 this embodiment makes it possible to form a wire-shaped solar cell device. Furthermore, like Embodiment 10, this embodiment makes it possible to form the same structure using extrusion molding, dip coating, or the like.

Each of Embodiments 9-11 can provide a thin-film forming apparatus for forming a uniform thin film on a wire and a minute organic EL device that uses a wire.

Embodiment 12

Figure 17:
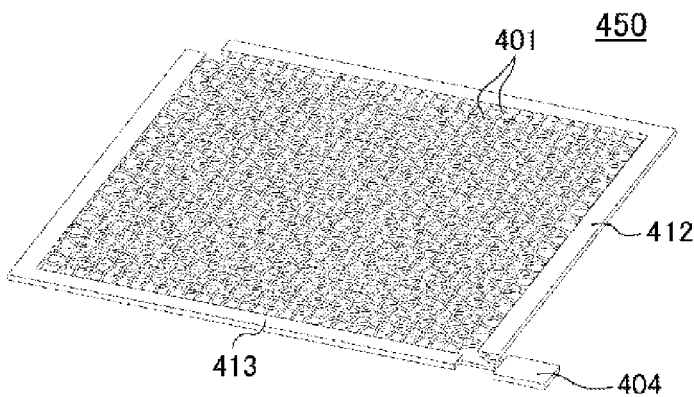
FIG. 17 shows a general configuration of a light-emitting device according to Embodiment 12.

Next, Embodiment 12 of the invention will be described with reference to FIG. 17. This embodiment uses wire-shaped organic EL devices produced according to Embodiment 10, Embodiment 11, or the like. FIG. 17 shows a general configuration of a light-emitting device 450 according to the embodiment. The light-emitting device 450 has a cloth-shaped light-emitting unit that is produced by weaving weft threads and warp threads which are wire-shaped organic EL devices 401. The light-emitting device 450 is configured in such a manner as to have anode-side terminals 412 that are connected to one ends of the organic EL devices 401 and cathode-side terminals 413 that are connected to other ends of the organic EL devices 401 and to be able to emit light when connected to a power source 404 via the terminals 412 and 413.

According to the embodiment, a flexible light-emitting device 450 that can be deformed freely can be produced by weaving organic EL devices 401 into a cloth form and can be installed in a desired manner according to the shape of its installation location. The light-emitting device 450 may be manufactured by some other weaving method. Instead of being weaved, organic EL devices 401 may be sewed into a cloth or the like so as to form a prescribed shape (character or pattern) and thereby emit light from corresponding portions of the cloth.

Embodiment 13

Figure 18:
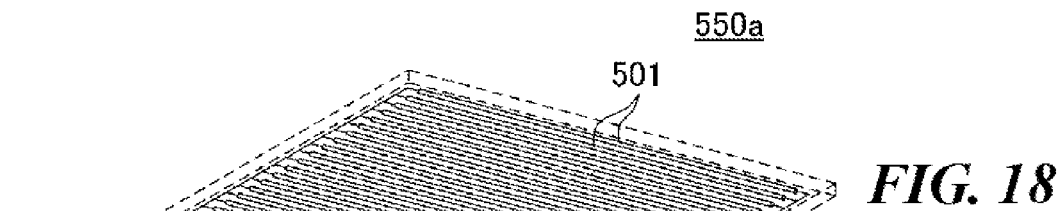
FIG. 18 shows a general configuration of a light-emitting device according to a Embodiment 13.

Next, Embodiment 13 of the invention will be described with reference to FIG. 18. This embodiment uses wire-shaped organic EL devices produced according to Embodiment 10, Embodiment 11, or the like. FIG. 18 shows a general configuration of a light-emitting device 550a according to the embodiment. The light-emitting device 550a is produced by connecting a large number of wire-shaped organic EL devices 501 arranged in parallel and connecting them to a power source 503 in parallel and is thereby capable of surface light emission. By virtue of the use of wire-shaped organic EL devices 501, the light-emitting device 550a according to the embodiment is advantageous over light-emitting devices in which an organic EL device is formed on a substrate in that its size can be adjusted merely by changing the number of organic EL devices 501 arranged and their length and it can be implemented as a large-size device.

Therefore, the light-emitting device 550a can be used as a large-size illumination device or a backlight of a large-size display device. Since the organic EL devices 501 are wire-shaped and hence can be curved, the light-emitting device 550a can be used as a light-emitting device that can be installed in a desired manner according to the shape of its installation location. A light-emitting device both of whose front surface and back surface are capable of light emission can be constructed and used for a display device that displays information on both its surfaces. As such, the embodiment can provide such display devices as a guide board and an electronic terminal that can display information on both their surfaces.

To increase the efficiency of the light-emitting device 550a, a reflector may be disposed behind the organic EL devices 501. A lens or filter may be disposed in front of the organic EL devices 501 to flatten the light emission profile. Furthermore, a light-emitting device having a low direction dependence of its light emission intensity can be provided by disposing a pair of light-emitting devices 550a in such a manner that they are inclined so as to form an angle 90°.

Figure 19:
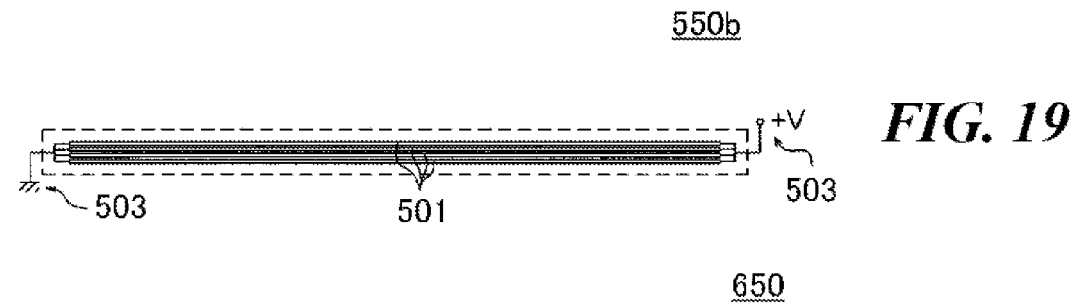
FIG. 19 shows a general configuration of another light-emitting device according to Embodiment 13.

FIG. 19 shows a general configuration of another light-emitting device 550b according to the embodiment. The light-emitting device 550b is a straight light-emitting device that is produced by bundling wire-shaped organic EL devices 501 and connecting them to a power source 503 in parallel. The light-emitting device 550b according to the embodiment can be used in place of a straight-tube fluorescent lamp, as a lightweight, high-efficiency illumination device. The light emission intensity of the light-emitting device 550b can be adjusted easily by changing the number of organic EL devices 501. Since the organic EL devices 501 are in thin wire form, a flexible light-emitting device 550b can be constructed and installed in a desired manner according to the shape of its installation location. For example, the organic EL devices 501 can not only be shaped straightly and arranged in a plane (described above) but also be shaped so as to include a curved portion such as a spiral or spring-like portion. With such configurations, light-emitting devices having various shapes such as a pillar shape, a circular shape, and a spherical shape can be manufactured easily. Furthermore, organic EL devices 501 may be twisted into a rope or cord shape.

Each of the light-emitting devices 550a and 550b can be installed in a flexible manner without disordering the arrangement of the organic EL devices 501 by sealing in it in the manner indicated by a broken line in FIG. 18 or 19. Furthermore, the advantages of the embodiment can also be obtained even by sticking the light-emitting devices 550a or 550b to a sheet made of PET, a silicone resin, or the like or inserting it between sheets made of such a material.

Embodiment 14

Figure 20:
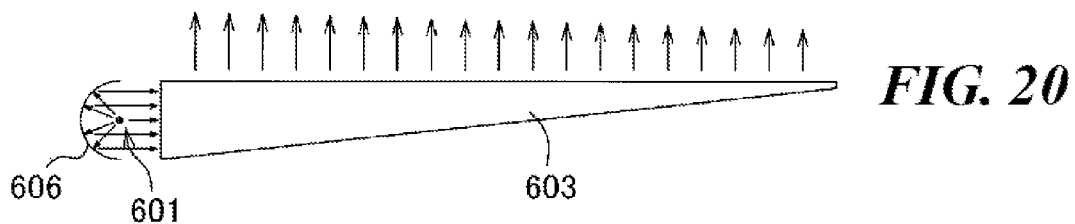
FIG. 20 shows a general configuration of a light-emitting device according to Embodiment 14.

Next, Embodiment 14 of the invention will be described with reference to FIG. 20. This embodiment uses wire-shaped organic EL devices produced according to Embodiment 10, Embodiment 11, or the like. FIG. 20 shows a general configuration of a light-emitting device 650 according to the embodiment. The light-emitting device 650 is an edge-light light-emitting device which emits light by guiding light emitted from a wire-shaped organic EL device 601 to a light guide plate 603 by a reflector 606 that is disposed behind the organic EL device 601. The light-emitting device 650 can be made smaller in the number of constituent members and thereby made thinner than cold cathode tubes used in light emitting devices of this type. Furthermore, a device incorporating the light-emitting device 650 can be made thinner and smaller.

A cloth-shaped, planar, or straight-tube-type solar cell unit (solar power generation unit) can be manufactured by using a wire-shaped solar cell device or devices described above in place of an organic EL device or devices 401, 501, or 601 used in the light-emitting device 450, 550a, 550b, or 650 shown in FIG. 17, 18, 19, or 20. For example, clothes may be manufactured using a cloth manufactured by weaving thread-shaped solar cell devices, to drive a semiconductor device attached to the clothes by electricity that is generated by the cloth-shaped solar cell device.

With this configuration, a wearable computer can be manufactured in which a computing unit, a storage unit, a manipulation unit, a display unit, etc. can be supplied with power from a cloth-shaped solar cell device that is part of clothes. It is also possible to manufacture a power-sourceless wearable computer by equipping it with a battery for storing power that is generated by a cloth-shaped solar cell device. In this case, clothes may be a garment such as a coat, a sweater, a sweat suit, a jacket, a shirt, a suit, trousers, or a skirt or a small article such as a cap or a glove. When a cloth-shaped solar cell device is used in clothes that are warn outside is preferable, high power generation efficiency is obtained which is preferable in the case where a display unit or a manipulation unit is provided. Clothes capable of emitting light when necessary (e.g., at night) or displaying various kinds of information (e.g., information indicating a party to which the person belongs) may be manufactured by incorporating, in the clothes, a light-emitting unit or a display unit as a semiconductor device. A configuration is possible in which a battery provided in clothes is charged with power generated by a cloth-shaped solar cell device and supplies power to another device. For example, when a wireless power supply device is provided at a pocket, a portable electronic device having a wireless power receiving device can be charged merely by putting it in the pocket.

Embodiment 15

Next, the configurations of an electrostatic spraying device and an electrostatic coating device according to Embodiments 15 to 18 of the invention will be outlined with reference to FIG. 1. FIG. 1 shows a general configuration of an electrostatic spraying device 32 (electrostatic coating device) according to the embodiment. The electrostatic spraying device 32 forms bumps or forms an interconnection(s) three-dimensionally (three-dimensional interconnection(s)) on a work 5 by electrostatic spraying. The work 5 is typically a substrate on which plural bumps are to be arranged at small intervals, a substrate having steps, or the like, the embodiment is not limited to such a case; the work 5 may be a glass plate or a semiconductor chip rather than a substrate. A semiconductor device, a MEMS device, etc. can be manufactured by performing the electrostatic spraying or electrostatic coating according to the embodiment on the work 5. For example, the bumps are Ag bumps, Au bumps, Cu bumps, Ni bumps, or solder bumps. For example, the interconnections include insulating films such as polyimide films (PI films) and conductive films such as Au interconnections.

The electrostatic spraying device 32 is mainly composed of a nozzle 2, a controller 10, and a table 7 on which a work 5 is to be placed. The controller 10 include a voltage control device for applying a prescribed voltage to the nozzle 2. A liquid agent is supplied to the nozzle 2 from the direction indicated by arrow A in FIG. 1. A proper liquid agent is selected according to the type of a thin film (insulating film or conductive film interconnection) to be formed on the work 5. That is, ingredients of a film to be formed on the work 5 are selected as a liquid agent.

The controller 10 applies a prescribed voltage between an electrode 2a of the nozzle 2 and an electrode 7a of the table 7. The work 5 is placed on the table 7 so as to be opposed to a tip portion 21 of the nozzle 2 (nozzle tip portion). The diameter (i.e., the inner diameter for passage of a liquid agent) of the nozzle tip portion is set at about 5 to 400 μm, for example.

When the prescribed voltage is applied by the controller 10, a liquid agent is sprayed from the tip portion 2b of the nozzle 2 toward the work 5. Repulsion occurs in the liquid agent that is located inside the nozzle 2 due to the electrostatic force produced by the application voltage, and the liquid agent becomes fine particles against the surface tension of the liquid surface in the tip portion 2b of the nozzle 2. Charged positively or negatively, the fine particles of the liquid agent repel each other and hence can be sprayed without cohering together. Immediately after being sprayed from the tip portion 2b of the nozzle 2, the liquid agent is in the form of particles 31a having relatively large diameters. Then the liquid agent is transformed into particles 31b having relatively small diameters, which are deposited on the work 5. A thin film (insulating film or conductive film) of the liquid agent is formed on the surface of the work 5 by solidifying the deposited particles 31b (liquid agent).

In the embodiment, the thickness of thin film (insulating film or conductive film) formed on the work 5 is about 0.2 to 30 μm, for example, and a uniform thin film can be formed. The thickness of a bump or an interconnection to be formed on the work 5 can be set as appropriate according to its ingredients (i.e., the type of an insulating film or a conductive film). As described above, the electrostatic spraying technique according to the embodiments makes it possible to form a thin film that cannot be formed by any background-art spraying techniques. Furthermore, the electrostatic spraying can form a uniform film of the liquid agent on the work 5 (including its side surfaces) even in the case where the work 5 has level difference portions (projections).

Figure 36:
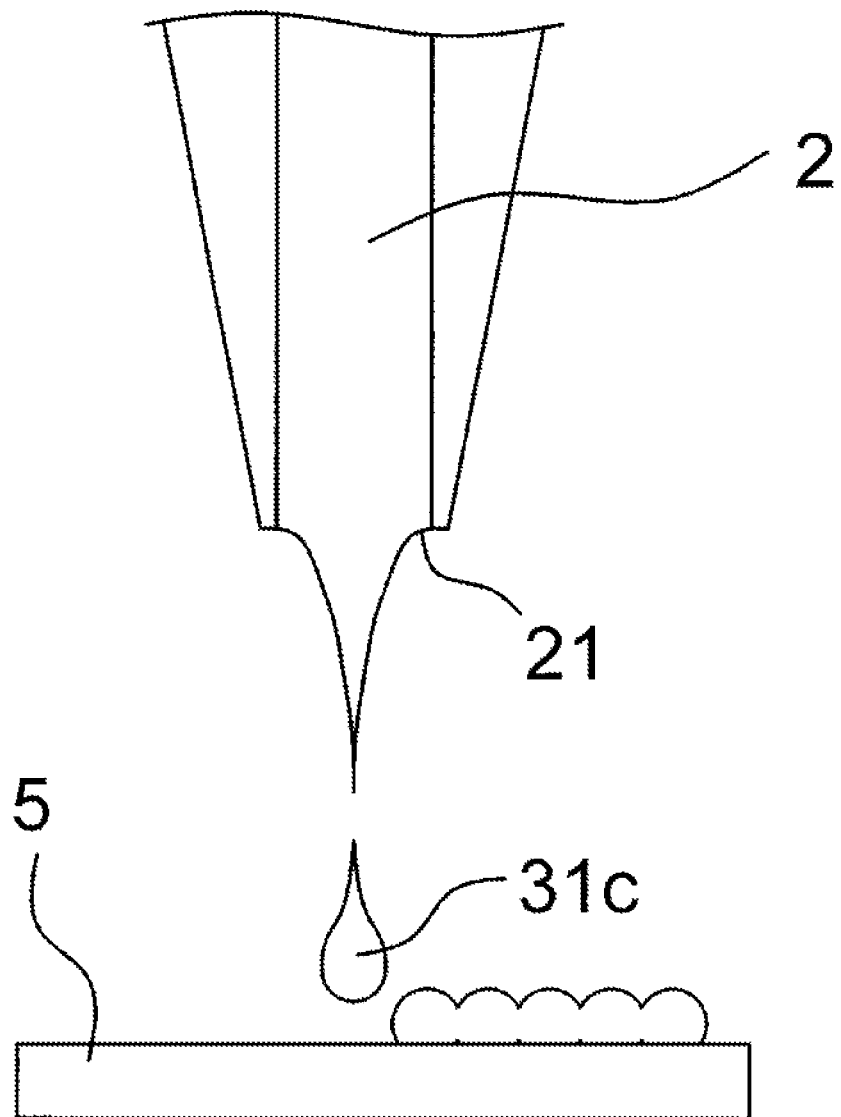
FIG. 36 illustrates electrostatic coating employed in Embodiments 15 to 18.

Now, the electrostatic coating that is employed in the embodiment will be outlined with reference to FIG. 36. In the electrostatic coating, unlike in the electrostatic spraying, a liquid agent is jetted onto the work 5 straightly instead of being sprayed while a pulse voltage, for example, is applied to the nozzle 2 that is set close to the work 5. More specifically, a liquid agent becomes a small droplet 31c against the surface tension of the liquid surface in the tip portion 21 of the nozzle 2 due to the electrostatic force produced by the application of the pulse voltage. Because of the application of the pulse voltage, the droplet is not charged to a level corresponding to a voltage that enables spraying and hence is attracted by the work 5 without being converted into very small particles. As a result, the droplet is jetted onto the work 5 straightly instead of being sprayed, to enable coating at a thickness corresponding to the size of the droplet. This electrostatic coating may be applied to every embodiment of this application, if necessary.

Therefore, minute bumps can be formed by dotted application of droplets without moving the nozzle 2 and a minute interconnection can be formed by applying droplets repeatedly to so as to form a line while moving the nozzle 2.

Next, how to generate a voltage to be applied in the electrostatic spraying device 32 (to generate static electricity) will be described with reference to FIGS. 2 and 3A to 3C. FIG. 2 illustrates a DC voltage that is applied in the electrostatic spraying device 32. FIGS. 3A to 3C illustrate a pulse voltage that is applied in the electrostatic spraying device 32. Electrostatic spraying is performed by spraying a liquid agent from the nozzle 2 toward the work 5 while a DC voltage is applied as shown in FIG. 2. Electrostatic spraying or coating is performed by applying a liquid agent from the nozzle 2 to the work 5 while a pulse voltage is applied as shown in FIGS. 3A to 3C.

FIG. 2 shows a state that the work 5 (table 7) is grounded (connected to GND) and a positive (+) DC voltage is applied to the nozzle 2 (a case of electrostatic spraying). However, the embodiment is not limited to this case; a negative (−) DC voltage may be applied to the nozzle 2. Whether to use a positive voltage or a negative voltage is set as appropriate according to the materials of the liquid agent and the work 5 and other factors. Since it suffices to apply a voltage of a fixed polarity, the voltage is not limited to a DC voltage; a control may be made so that the magnitude of the voltage is varied during spraying while its polarity is maintained. Furthermore, a pulse voltage may be applied whose magnitude varies between a high level and a low level of a fixed polarity (positive or negative). Where such a pulse voltage is applied, it may either include or not include 0 V. In the embodiment, the distance d between the tip portion 2b of the nozzle 2 and the surface of the work 5 is set at about 0.5 to 20 mm, for example.

FIGS. 3A to 3C show a state that the controller 10 of the electrostatic spraying device 32 applies to the nozzle 2 a pulse voltage whose polarity with respect to the work 5 (table 7) becomes positive or negative alternately (pulse oscillation is caused). The electrostatic coating that is performed using a pulse voltage is used suitably for a case of forming bumps or interconnections selectively on the surface of the work 5. This is because a liquid agent is applied, instead of sprayed, from the nozzle 2 according to the polarity of the pulse voltage.

Where a pulse voltage is applied, first, a positive voltage (+ voltage) is applied to the nozzle 2 as shown in FIG. 3A. At this time, positive charges (+ charges) are accumulated in the surface (nozzle-2-side surface) of the work 5 and this surface is charged positively. Then, as shown in FIG. 3B, a negative voltage (− voltage) is applied to the nozzle 2. At this time, particles 31b sprayed electrostatically from the nozzle 2 are charged negatively and hence stick to (hit) the surface of the work 5 being charged positively. Then, as shown in FIG. 3C, a positive voltage (+ voltage) is applied to the nozzle 2. At this time, particles 31b sprayed electrostatically from the nozzle 2 are charged positively and hence stick to the surface of the work 5.

Particles 31b are deposited on the work 5 by repeatedly establishing the state that the negative voltage is applied (see FIG. 3B) and the state that the positive voltage is applied (see FIG. 3C) (i.e., by applying the pulse voltage). The magnitude of the pulse voltage is set at about 0.5 to 10 kV, for example, and the pulse width (spraying speed) is set so as to correspond to about 5 Hz to 1 kHz, for example. The distance d between the tip portion 2b of the nozzle 2 and the work surface is set at about 0.5 to 20 nm, for example.

In the embodiment, the spraying distance, that is, the position (height) of the nozzle 2, may be controlled to control the particle diameters of particles 31b that reach the work 5. FIG. 4 shows how a position control (height control) is performed on the nozzle 2 (nozzle tip portion) in the electrostatic spraying device 32. As shown in FIG. 4, the electrostatic spraying device 32 is equipped with a camera 8 which is disposed so as to be able to observe particles 31b that have reached the surface of the work 5. Particle diameters or a coating state of particles 31b is thus observed using the camera 8, and a control is performed so as to move the nozzle 2 to a desired position according to an observation result. For example, as shown in FIG. 4, it is possible to change the distance between the nozzle tip portion and the surface of the work 5 from d1 to d2 during spraying.

Such a control can be performed automatically through image processing or manually. The method for controlling particle diameters is not limited to changing the height or the position in the left-right direction of the nozzle 2; for example, a configuration may be employed in which the nozzle diameter, the magnitude or pulse width of an application voltage is changed. This control is effective in the case where the electrostatic characteristic of the work 5 varies while bumps or interconnections are being formed on the work 5.

In the embodiment, a configuration is possible in which the nozzle 2 is equipped with plural nozzle portions. In this case, to place a liquid agent (to form a bump or an interconnection) uniformly on the work 5, voltages (pulse voltages) that are applied to the plural respective nozzle portions may be controlled independently of each other. The arrangement of the plural nozzle portions may be varied from one prescribed region to another. Setting magnitudes of voltages makes it possible to form a bump or an interconnection with a more uniform thickness distribution.

In the following, a specific description will be made of each of a method for forming bumps utilizing electrostatic coating and a method for forming a three-dimensional interconnection(s) utilizing both of electrostatic spraying and electrostatic coating.

Figure 21:
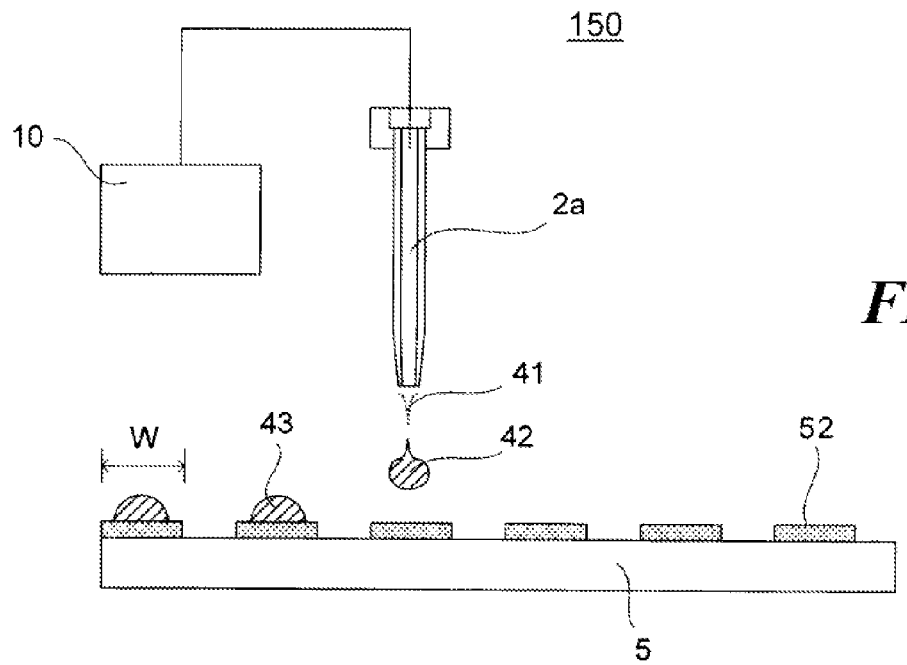
FIG. 21 illustrates a bump forming method according to Embodiment 15 which utilizes electrostatic coating.

First, Embodiment 15 of the invention will be described with reference to FIG. 21. FIG. 21 illustrates a bump forming method according to this embodiment and outlines a bump forming apparatus 150. This embodiment relates to a method for forming minute bumps 43 on a work 5 utilizing the above-described electrostatic coating method.

As shown in FIG. 21, the bump forming apparatus 150 has a nozzle 2a which applies a droplet 41 of a liquid agent as ingredients of a bump (conductor) when a prescribed pulse voltage is applied to it by a controller 10 including a voltage control device. The controller 10 performs a control so as to form a bump 43 on a work 5 using a droplet 41 of a liquid agent. In the embodiment, since Ag bumps or Au bumps are formed suitably, a liquid agent (Ag nano-ink or Au nano-ink) in which a metal such as Ag or Au is dissolved in a solvent is used as a liquid agent as ingredients of bumps.

In the embodiment, the work 5 has a substrate 51 and pads 52 that are formed on the substrate 51. For example, in manufacture of a semiconductor device having a very high density wiring structure in which pads 52 are arranged at intervals of about 10 μm, it is necessary to form bumps 43 that are smaller than these intervals. In background-art bump forming methods using a printing method, relatively large bumps having a diameter of about 200 to 300 μm are formed, that is, minute bumps that can be used for a high-density structure as shown in FIG. 21 cannot be formed.

In view of the above, in the embodiment, minute bumps are formed utilizing electrostatic coating. More specifically, the nozzle 2a is placed over a pad 52 and a pulse voltage is applied between the nozzle 2a and the work 5. When the pulse voltage is applied, a liquid agent as ingredients of a bump 43 is discharged by electrostatic coating according to the pulse voltage and is applied to the work 5 at the prescribed position (on the pad 52) in the form of a single droplet (particle 42). A minute bump 43 having a diameter of about 3 to 10 μm can be formed by this electrostatic coating method.

To increase the adhesion between the pads 52 and pads of an external device to which the bumps 43 are to be connected, an Ni film may be formed by electrostatic spraying o electrostatic coating before or after the formation of the bumps 43. To dry the bumps 43, flux spraying may be performed after the formation of the bumps 43 on the work 5. The flux spraying is to remove oxides on the metal surfaces chemically by spraying formic acid or the like from a nozzle toward the bumps 43 formed on the work 5.

As described above, according to the embodiment, minute bumps that can be used to form a high-density structure can be formed utilizing the electrostatic coating method.

Bumps 43 may be formed on both surfaces of a work 5 rather than one surface of a work 5 (described above). More specifically, edge portions of the work 5 are held and a liquid agent (droplets 41) is discharged from nozzles 2a that are directed to the top surface and the bottom surface of the work 5 toward the pads 52 arranged on the two surfaces of the work 5. In this case, bumps 43 can be formed even on the bottom surface of the work 5 because they are formed by the electrostatic coating method. In this case, since bumps 43 can be formed on both surfaces of a work 5, a lamination structure using the work 5 can be constructed easily.

Furthermore, by virtue of the use of the electrostatic coating method, bumps 43 can be formed not only on one surface of a work 5 but also on each side surface of a work 5 having a surface that is a combination of surfaces such as a bracket-shaped surface and an L-shaped surface.

Embodiment 16

Figure 22:
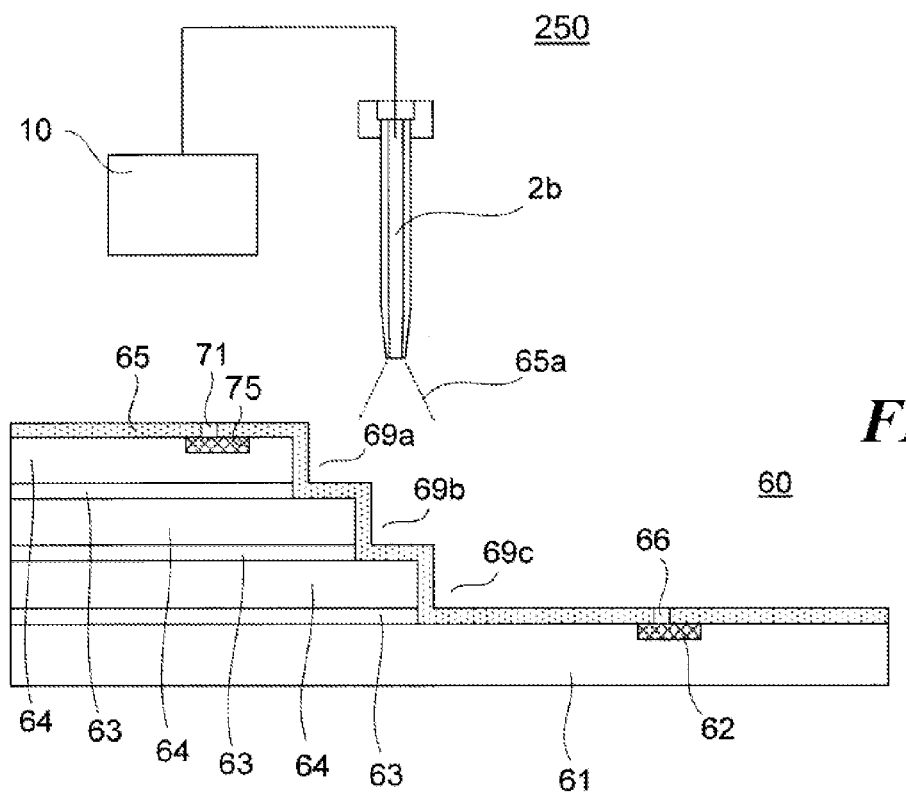
FIG. 22 illustrates a part, utilizing electrostatic spraying, of a three-dimensional interconnection forming method according to Embodiment 16.
Figure 23:
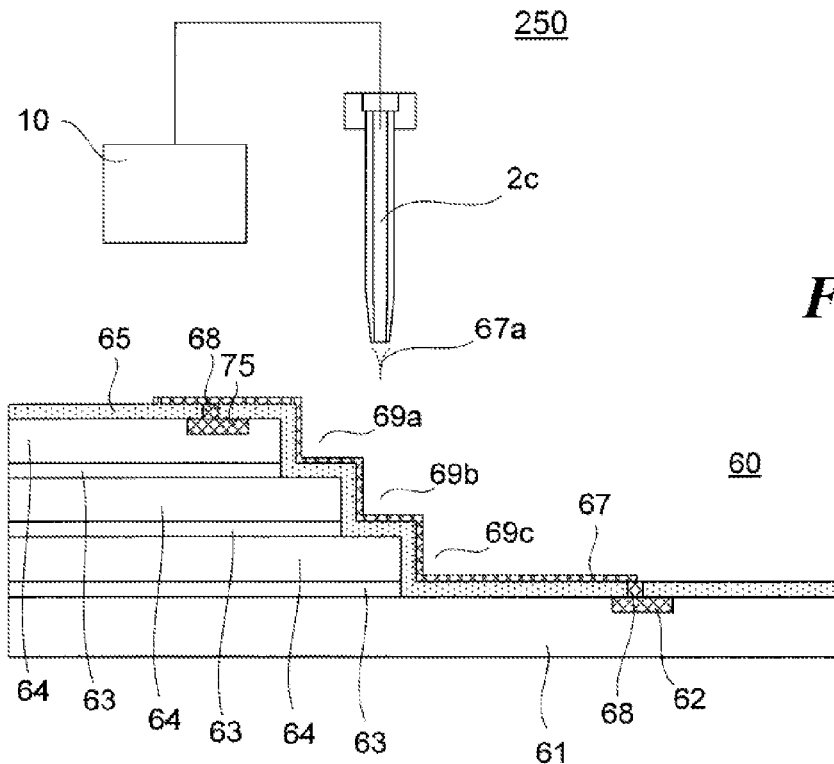
FIG. 23 illustrates another part, utilizing electrostatic coating, of the three-dimensional interconnection forming method according to Embodiment 16.
Figure 24:
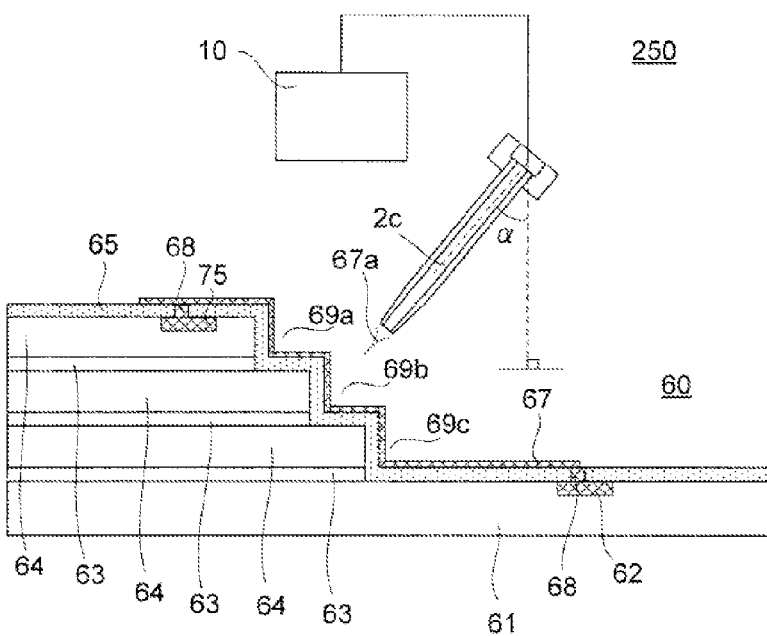
FIG. 24 illustrates another part, utilizing electrostatic coating, of the three-dimensional interconnection forming method according to Embodiment 16.

Next, Embodiment 16 of the invention will be described with reference to FIGS. 22-24. FIGS. 22-24 illustrate a three-dimensional interconnection forming method according to this embodiment and outlines a three-dimensional interconnection forming apparatus 250. The embodiment relates to a method for forming a three-dimensional interconnection on a work 60 (in Embodiments 16 and 17, the term "work 60" is used instead of "work 5") having steps and utilizes the above-described electrostatic spraying method and electrostatic coating method. The work 60 is constructed in such a manner that three structural bodies (layers) each including a die-attach layer 63 and a semiconductor chip (die) 64 are laid one on another on a substrate 61. End portions of the respective structural bodies (layers) are deviated from each other so as to form three steps 69a, 69b, and 69c.

FIG. 22 shows how a polyimide film 65 (insulating film) is formed by electrostatic spraying. The three-dimensional interconnection forming apparatus 250 according to the embodiment has a nozzle 2b (first nozzle) which sprays a liquid agent 65a (first liquid agent) as ingredients (first ingredients) of a polyimide film 65 toward the work 60 when a first voltage is applied to it. The nozzle 2b may be a multiple nozzle having plural nozzle portions. A controller 10 performs a control so as to cover a portion, where to form a three-dimensional interconnection, of the work 60 using the liquid agent 65a.

In the embodiment, to form a polyimide film 65 in a relatively wide area, the controller 10 sprays the liquid agent 65a as the ingredients of the polyimide film 65 toward the work 60 by applying a prescribed DC voltage between the nozzle 2b and the work 60. In this manner, a uniform, thin polyimide film 65 can be formed by electrostatic spraying on even the work 60 which has the steps 69a, 69b, and 69c (see FIG. 22). Thus, the polyimide film 65 can be formed which functions as a resist film (insulating film).

A semiconductor chip 64 is formed with an electrode portion 75 for electrical connection to an Au interconnection (described later). Therefore, the liquid agent 65a is not sprayed so as to be directed to the electrode portion 75 and a hole 71 is formed that is not filled with any portion of the polyimide film 65. Likewise, the substrate 61 is formed with an electrode portion 62 for electrical connection to the Au interconnection (described later). Therefore, the liquid agent 65a is not sprayed so as to be directed to the electrode portion 62 and a hole 66 is formed that is not filled with any portion of the polyimide film 65.

FIG. 23 shows how an Au interconnection 67 (metal interconnection) is formed by electrostatic coating. The three-dimensional interconnection forming apparatus 250 according to the embodiment has a nozzle 2c (second nozzle) which applies a liquid agent 67a (second liquid agent) as ingredients (second ingredients) of an Au interconnection 67 toward the work 60 when a second voltage is applied to it. The nozzle 2c may be a multiple nozzle having plural nozzle portions. The controller 10 performs a control so as to form a three-dimensional interconnection on the work 60 using the liquid agent 67a. There is some difficulty in applying the Au interconnection 67 to the surfaces of the steps 69a, 69b, and 69c because they are parallel with the nozzle 2c. Therefore, if necessary, the nozzle 2c may perform application while being inclined.

In the embodiment, the Au interconnection 67 is formed (e.g., locally) in a selected part of the region where the polyimide film 65 is formed. It is therefore preferable that the Au interconnection 67 be formed by electrostatic coating rather than electrostatic spraying. Therefore, the controller 10 applies the liquid agent 67a (second liquid agent) as ingredients (second ingredients) of the Au interconnection 67 toward the work 60 when a prescribed pulse voltage is applied between the nozzle 2c (second nozzle) and the work 60. According to the embodiment, a minute Au interconnection having a line width of about 3 to 10 μm, for example, can be formed. At this time, since the liquid agent 67a goes into the hole 66 formed over the electrode portion 62 and the hole 71 formed over the electrode portion 75, Au layers 68 are formed in the respective holes 66 and 71, whereby the Au interconnection 67 electrically connects the electrode portions 62 and 75 to each other. In this manner, even in, for example, a configuration that requires connection by wires because of interposition of another chip, an electrical connection can be established by a three-dimensional Au interconnection 67. This makes it possible to increase the processing speed of a semiconductor chip through shortening of wiring distances. Since the Au interconnection 67 is stuck to the surface of the work 60, it is not broken due to a warp of the work 60. This enables wiring on a flexible work 60.

FIG. 24 shows how an Au interconnection 67 is formed on the side surfaces of the steps 69a, 69b, and 69c. In forming the Au interconnection 67 on the side surfaces of the steps 69a, 69b, and 69c by electrostatic coating, it is preferable to apply the liquid agent 67a in a state that the nozzle 2c is inclined by a proper angle (see FIG. 24). For example, the nozzle 2c is inclined by an angle α with respect to the nozzle 2c performing electrostatic coating on a flat portion of the work 60. Unlike in electrostatic spraying, in electrostatic coating the liquid agent 67a discharged from the nozzle 2c is applied locally. Therefore, portions of an Au interconnection 67 can also be formed uniformly on the side surfaces of the steps 69a, 69b, and 69c by performing electrostatic coating in the state that the nozzle 2c is inclined by the prescribed, fixed angle α. Incidentally, basically the nozzle 2b (first nozzle) sprays the liquid agent 65a toward the side surfaces of the steps 69a, 69b, and 69c from the direction that is perpendicular to the work 60. However, like the nozzle 2c (second nozzle), the nozzle 2b may be inclined by a prescribed angle in performing spraying on the side surfaces of the steps 69a, 69b, and 69c.

The above description is directed to the three-dimensional interconnection including the polyimide film 65 and the Au interconnection 67. However, the embodiment is not limited to such a case; a three-dimensional interconnection may be constructed by an insulating film other than a polyimide film and a metal interconnection other than an Au interconnection. A three-dimensional interconnection may be constructed so as to include another insulating film or another metal interconnection. Furthermore, a three-dimensional interconnection may be formed only by a metal interconnection without an insulating film.

A protective film for protecting the Au interconnection 67 may be formed by electrostatic spraying by forming another polyimide film 65 on the work 60 after the formation of the Au interconnection 67. Furthermore, a conductive film or a conductive mesh may be formed as an electromagnetic shield layer for interrupting electromagnetic waves on the top surface of the protective film by electrostatic spraying.

Each of Embodiments 15 and 16 can provide a bump forming apparatus and method for forming minute bumps on a work or a three-dimensional interconnection forming apparatus and method for forming a minute three-dimensional interconnection having a uniform size (thickness and width) distribution on a work having steps.

Embodiment 17

Figure 25:
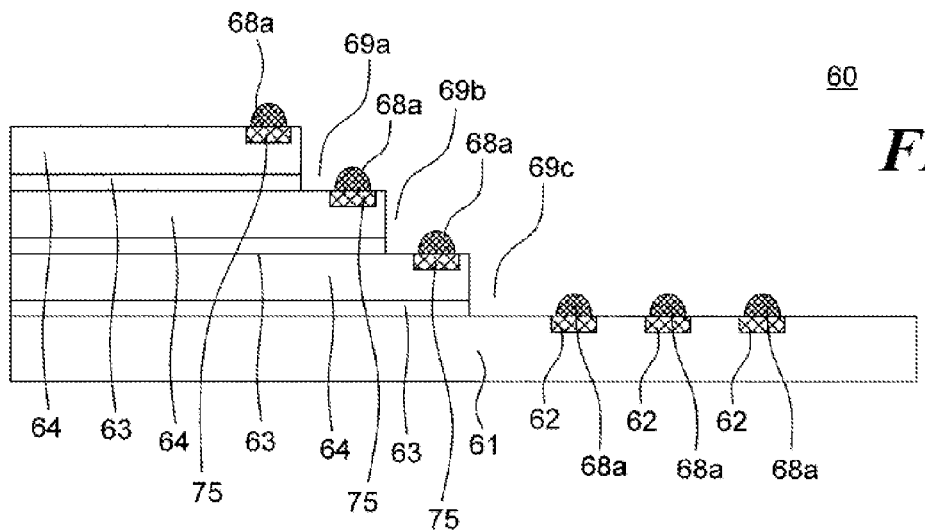
FIG. 25 illustrates a three-dimensional interconnection forming method according to Embodiment 17 which utilizes electrostatic coating.
Figure 26:
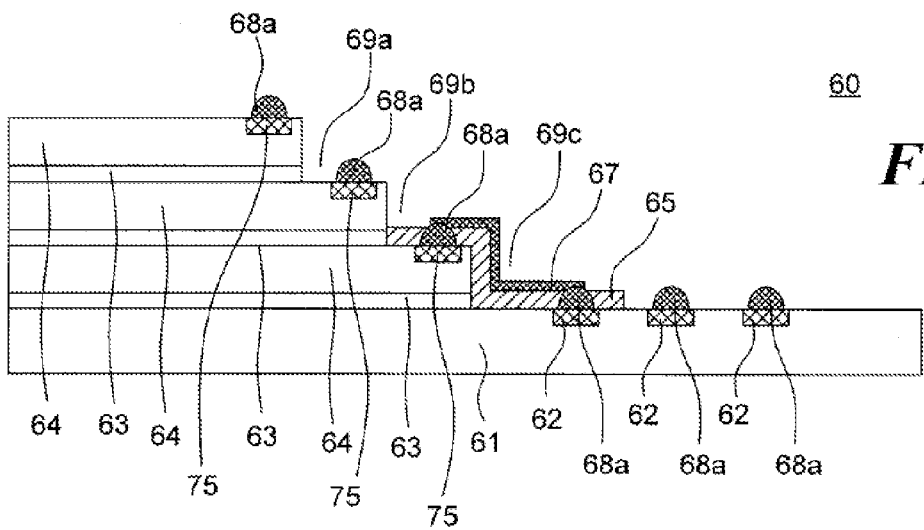
FIG. 26 illustrates the three-dimensional interconnection forming method according to Embodiment 17 which utilizes electrostatic coating.

Next, Embodiment 17 of the invention will be described with reference to FIGS. 25-31. In this embodiment, plural three-dimensional interconnections are laid one on another. First, as shown in FIG. 25, bumps 68a to function in the same manner as the above-described Au layers 68 are formed on electrode portions 62 and 75. Then, as shown in FIG. 26, a polyimide film 65 is formed so as to avoid the electrode portions 62 and 75 and an Au interconnection 67 is formed so as to electrically connect a bump 68a of an electrode portion 62 formed in a substrate 61 to a bump 68a of an electrode portion 75 formed in a first-stage semiconductor chip 64, whereby a three-dimensional interconnection is formed.

Figure 27:
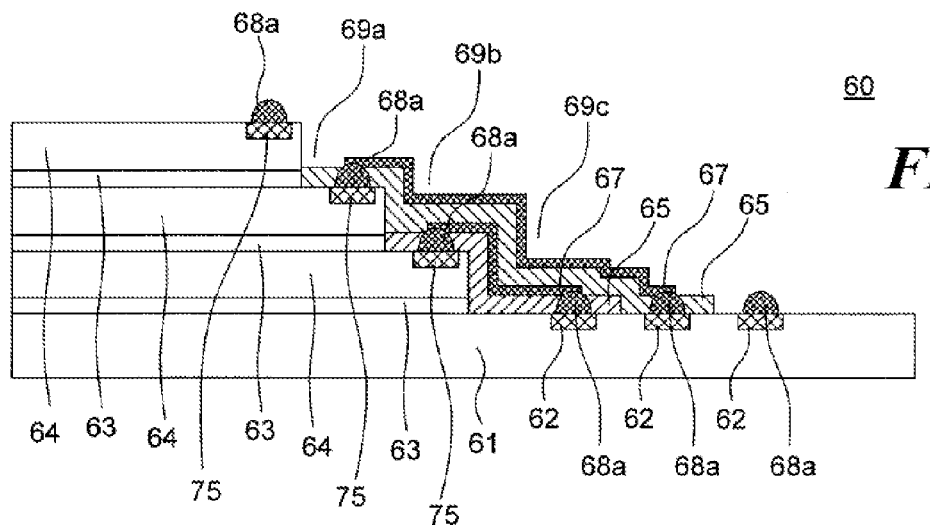
FIG. 27 illustrates the three-dimensional interconnection forming method according to Embodiment 17 which utilizes electrostatic coating.
Figure 28:
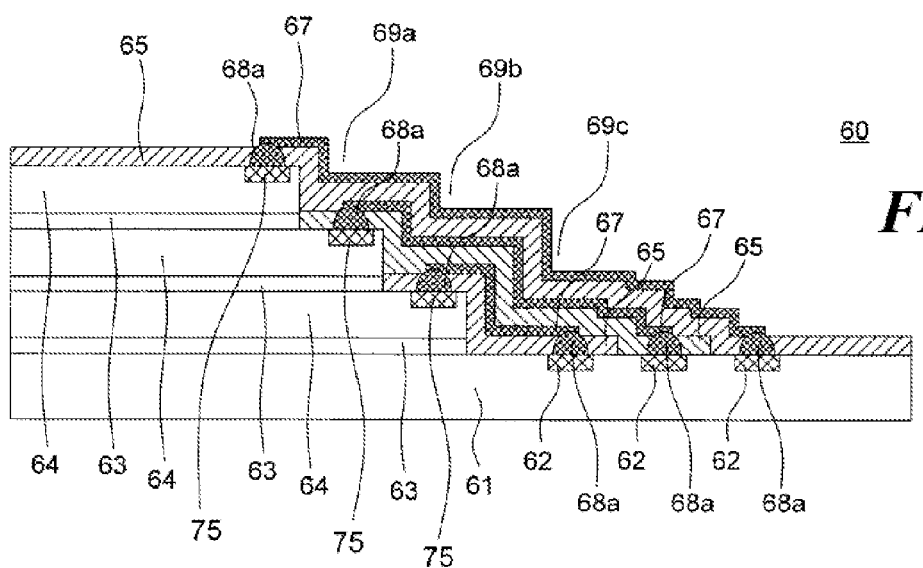
FIG. 28 illustrates the three-dimensional interconnection forming method according to Embodiment 17 which utilizes electrostatic coating.

Subsequently, as shown in FIG. 27, a three-dimensional interconnection is formed so as to connect a bump 68a of the substrate 61 to a bump 68a of an electrode portion 75 formed in a second-stage semiconductor chip 64. Then, as shown in FIG. 28, a three-dimensional interconnection is formed so as to connect a bump 68a of the substrate 61 to a bump 68a of an electrode portion 75 formed in a third-stage semiconductor chip 64. In this manner, a wiring structure capable of electrically connecting the plural semiconductor chips 64 to the substrate 61 individually can be formed by laying the plural three-dimensional interconnections one on another by forming the polyimide films 65 and the Au interconnections 67 alternately. With this configuration, a three-dimensional wiring structure (lamination structure) can be formed in an extremely small area (range). The density of a three-dimensional wiring structure can thus be increased.

Figure 29:
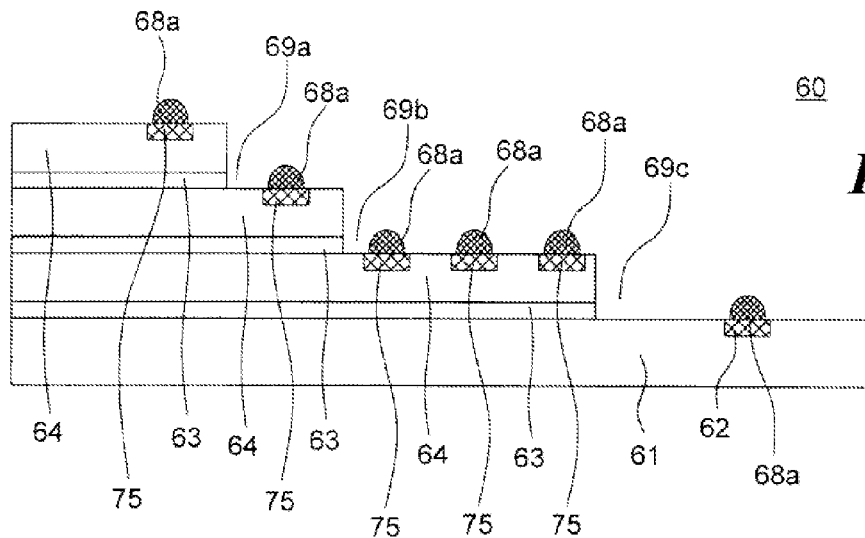
FIG. 29 illustrates the three-dimensional interconnection forming method according to Embodiment 17 which utilizes electrostatic coating.
Figure 30:
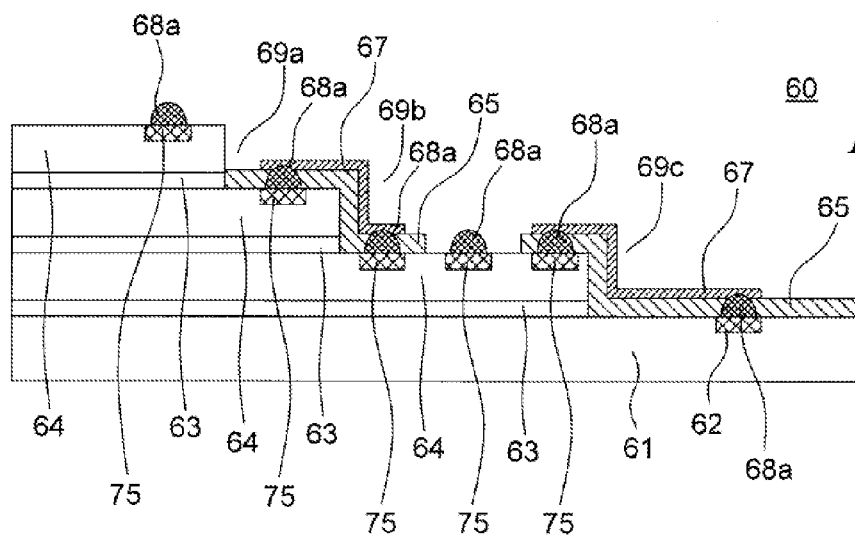
FIG. 30 illustrates the three-dimensional interconnection forming method according to Embodiment 17 which utilizes electrostatic coating.
Figure 31:
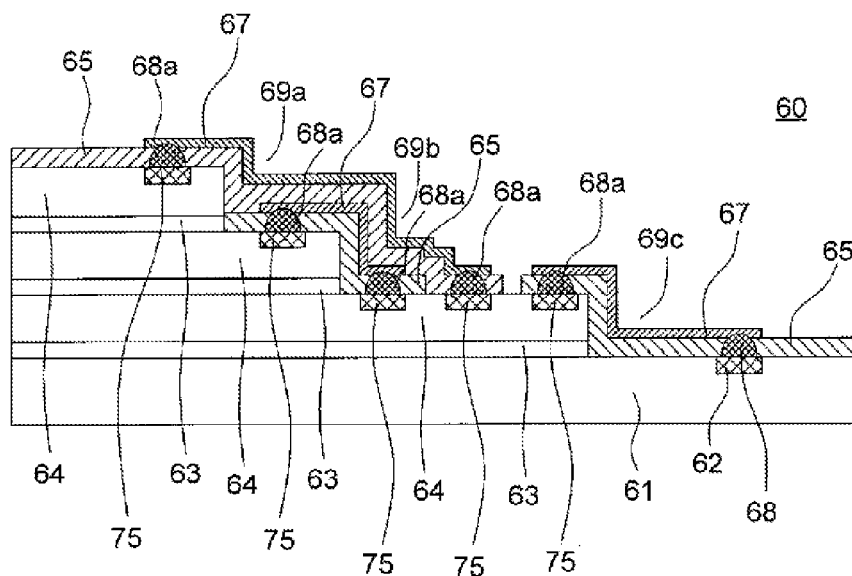
FIG. 31 illustrates the three-dimensional interconnection forming method according to Embodiment 17 which utilizes electrostatic coating.

It is also possible to form a three-dimensional interconnection that connects semiconductor chips 64 that are laid on each other. In this case, as shown in FIG. 29, bumps 68a are formed on electrode portions 62 and 75 by electrostatic coating. Then, as shown in FIG. 30, bumps 68a of electrode portions 75 formed in first-stage and second-stage semiconductor chips 64 that are laid on each other are connected to each other by an Au interconnection 67 whereas a bump 68a of a substrate 61 and a bump 68a of the first-stage semiconductor chip 64 are electrically connected to each other by another Au interconnection 67. As seen from FIG. 31, even the first-stage and third-stage semiconductor chips 64 that could not otherwise be connected electrically to each other unless wires are used together with bumps or the like because of the interposition of the second-stage semiconductor chip 64 can be electrically connected to each other by an Au interconnection 67 that connects bumps 68a of their electrode portions 75. This makes it possible to increase the processing speed of the semiconductor chip through shortening of wiring distances. Furthermore, this configuration enables formation of a desired wiring structure.

Embodiment 18

Figure 32:
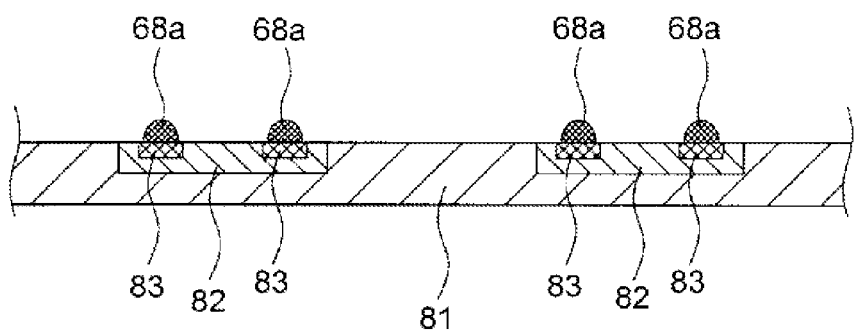
FIG. 32 illustrates a three-dimensional interconnection forming method according to Embodiment 18 which utilizes electrostatic coating.

Next, Embodiment 18 of the invention will be described with reference to FIGS. 32-35. In this embodiment, as shown in FIGS. 32-35, for a semiconductor chip that is sealed in a resin without forming any steps in such a manner that its one surface is exposed, a fan-out-type re-wiring layer which increases the intervals between terminals formed on this surface is formed three-dimensionally. As shown in FIG. 32, a work 85 (in this embodiment, the term "work 85" is used instead of "work 5") is constructed in such a manner that a semiconductor chip 82 is sealed in a resin 81 such as a thermosetting resin with its one surface exposed and electrodes 83 are formed on the one exposed surface.

Figure 33:
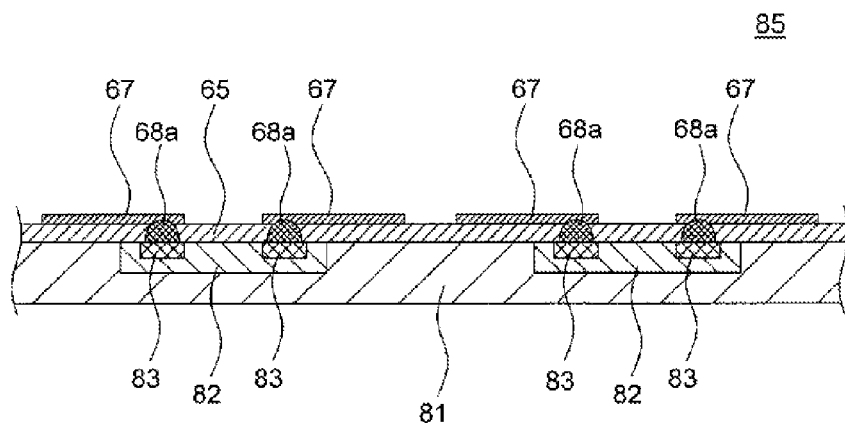
FIG. 33 illustrates the three-dimensional interconnection forming method according to Embodiment 18 which utilizes electrostatic coating.
Figure 34:
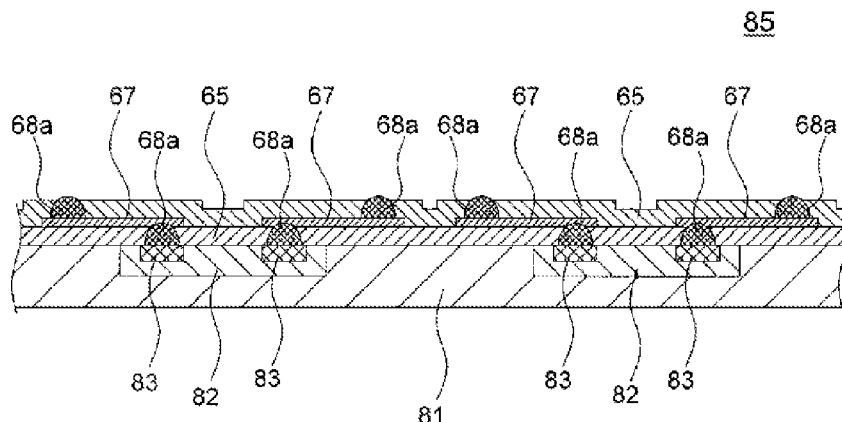
FIG. 34 illustrates the three-dimensional interconnection forming method according to Embodiment 18 which utilizes electrostatic coating.

As shown in FIG. 32, bumps 68a are formed on the electrodes 83 of the work 85 by electrostatic coating. Then, as shown in FIG. 33, a polyimide film 65 which is a resist film (insulating film) is formed so as to avoid the bumps 68a and Au interconnections 67 are formed so as to extend from the respective bumps 68a toward the outside of the semiconductor chip 82. Then, as shown in FIG. 34, bumps 68a are formed on respective tip portions of the Au interconnections 67 by electrostatic coating. Another polyimide film 65 is formed so as to avoid the bumps 68a, whereby the terminal intervals can be increased by forming terminals outside the semiconductor chip 82. In this state, in a plan view, the Au interconnections 67 extend outward from the plural respective electrodes 83 which are disposed adjacent to (close to) the edges of the semiconductor chips 82. As a result, a fan-out-type re-wiring layer in which the Au interconnections 67 extend radially (in a fan-like manner) to increase the terminal intervals can be formed three-dimensionally.

Figure 35:
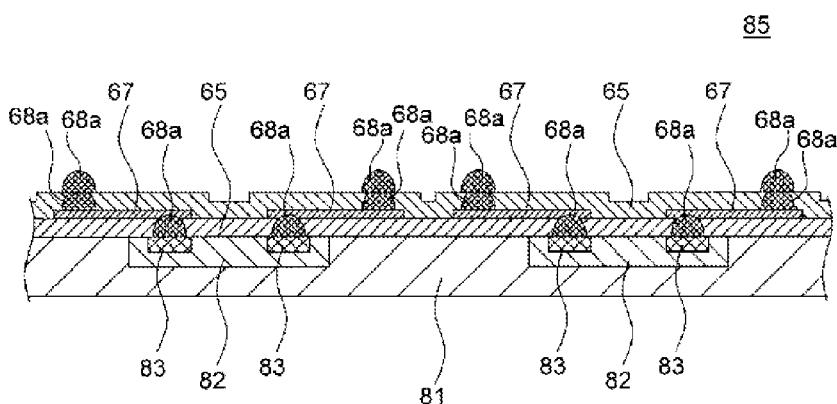
FIG. 35 illustrates the three-dimensional interconnection forming method according to Embodiment 18 which utilizes electrostatic coating.

As shown in FIG. 35, bumps 68a for connection to the outside may further be formed on the already formed bumps 68a of the re-wiring layer, respectively, by electrostatic coating. Individual semiconductor devices (fan-out-type semiconductor devices) can be produced from the work 85 by dicing the work 85 at the positions between the adjoining sets of bumps 68a for external connection (the center position in the figure). Although in the above embodiment the three-dimensional re-wiring layer is formed by the Au interconnections 67 and the bumps 68a, a three-dimensional re-wiring layer may be formed by directly connecting Au interconnections 67 to the respective electrodes 83 without forming bumps 68a.

In connection with Embodiments 15 to 18, another type of wiring structural body can be formed by forming both of bumps 43 and three-dimensional interconnections on a single work. For example, as for an interposer board in which plural semiconductor chips are laid one on another, it is possible to form three-dimensional interconnections on one surface (top surface) on which the semiconductor chips are laid one on another and form bumps 43 on the other surface (bottom surface) to be opposed to a target object on which the interposer board is to be mounted. In this case, where bumps 43 and three-dimensional interconnections are formed using the same liquid agent, they can be formed using the same nozzle, whereby a complex wiring structure can be formed as a low-cost structure. In each of these embodiments, the wiring structural body is not limited to one having a three-dimensional wiring structure; for example, it may be a wiring structural body that has a two-dimensional (planar) wiring structure on a base member such as a semiconductor chip or a substrate. Furthermore, a wiring structural body may be formed which is provided with a capacitor by forming a dielectric layer between metal interconnections.

A wiring structural body may be formed in which bumps, three-dimensional interconnections, or the like are formed on a work using a liquid agent that is synthesized by electrostatic spraying or electrostatic coating (a wiring structural body having at least one of bumps and interconnections). In this case, voltages having different polarities, that is, a positive voltage and a negative voltage, are applied to two respective nozzles and the work is grounded. Liquid agents discharged from the respective nozzles are combined together before reaching the work while being sprayed and a film is thereby formed on the work. In this manner, a bump 43, an insulating film, or a metal interconnection can be formed. For example, an insulating film can be formed using a settable resin that is set when a main agent and a setting agent are combined together. A warp or film damaging of a wiring structural body may be prevented by doing synthesis while, if necessary, adjusting the compositions of films that are laid one on another to make their linear expansion coefficients closer to each other.

Liquid agents discharged from the respective nozzles may be applied after being combined together by causing them to collide with each other. For example, to form solder bumps as bumps, their performance may be varied by making the discharge rates of tin and lead variable and thereby varying their contents. It is possible to form a high-quality wiring structural body in a desired manner by varying its quality by varying, according to required performance, the discharge rates of solder components tin (Sn), silver (Ag), copper (Cu), zinc (Zn), bismuth (Bi), indium (In), etc. that are discharged from nozzles.

The embodiments of the invention have been described above in a specific manner. However, the invention is not limited to the items described above as the embodiments and modifications can be made as appropriate without departing from the technical concept of the invention.

DESCRIPTION OF SYMBOLS

2: Nozzle
5: Work
7: Table
8: Camera
10: Controller
32: Electrostatic spraying device
100: Resist film forming apparatus
200: Conductive film forming apparatus
270: Semiconductor package
288: Resin
290: Conductive film
400: Phosphor film forming apparatus
480: LED chip
485: Phosphor
500: Insulating film forming apparatus
515: Wire
525: Insulating film
600: Liquid agent synthesizing apparatus
637: Thin film

The invention claimed is:

1. A conductive film forming method for forming a conductive film for electromagnetic shielding on a semiconductor package in which a resin covers a semiconductor chip by electrostatic spraying or electrostatic coating, comprising:
preparing a liquid agent as ingredients of the conductive film, the liquid agent including at least one of nickel, copper and silver;
applying a DC voltage or a pulse voltage to a nozzle;
spraying or applying particles of the liquid agent from the nozzle toward or to the resin covering the semiconductor chip of the semiconductor package;
moving the nozzle relative to the semiconductor package in X, Y and Z directions while maintaining a distance between a distal tip portion of the nozzle and a surface of the resin of the semiconductor package at about 0.5 to 20 mm; and
forming the conductive film on the semiconductor package using the particles of the liquid agent.

2. The conductive film forming method of claim 1, wherein
a magnitude of the DC voltage or the pulse voltage applied to the nozzle is set to cause a repulsion between neighboring particles of the liquid agent such that a repelling force acting between the neighboring particles due to the repulsion is larger than a cohering force acting between the neighboring particles due to a surface tension, thereby spraying the particles from the distal tip portion of the nozzle.

3. The conductive film forming method of claim 2, wherein
the pulse voltage is applied to the nozzle, and
the magnitude of the pulse voltage is set at about 0.5 to 10 kV, and a pulse width of the pulse voltage is set at about 5 Hz to 1 kHz.

4. The conductive film forming method of claim 1, wherein
the DC voltage or the pulse voltage is applied to substantially all of the nozzle between a proximal portion and the distal tip portion.

5. The conductive film forming method of claim 1, wherein
the nozzle is moved relative to the semiconductor package based upon an observed size of the particles of the liquid agent at the surface of the resin of the semiconductor package.

6. The conductive film forming method of claim 5, wherein
a distance between the distal tip portion of the nozzle and the surface of the resin of the semiconductor package is changed based upon the observed size of the particles of the liquid agent at the surface of the resin of the semiconductor package.

7. The conductive film forming method of claim 1, wherein
the conductive film comprises two or more layers.

8. The conductive film forming method of claim 7, wherein
the two or more layers of the conductive film are formed using different liquid agents.

* * * * *